(12) United States Patent
Chivukula et al.

(10) Patent No.: US 8,392,200 B2
(45) Date of Patent: Mar. 5, 2013

(54) LOW COMPLEXITY SPECTRAL BAND REPLICATION (SBR) FILTERBANKS

(75) Inventors: Ravi Kiran Chivukula, San Diego, CA (US); Yuriy Reznik, Seattle, WA (US)

(73) Assignee: QUALCOMM Incorporated, San Diego, CA (US)

( * ) Notice: Subject to any disclaimer, the term of this patent is extended or adjusted under 35 U.S.C. 154(b) by 513 days.

(21) Appl. No.: 12/759,248

(22) Filed: Apr. 13, 2010

(65) Prior Publication Data

US 2010/0262427 A1 Oct. 14, 2010

Related U.S. Application Data

(60) Provisional application No. 61/169,132, filed on Apr. 14, 2009.

(51) Int. Cl.
*G10L 19/02* (2006.01)
*G10L 19/00* (2006.01)
(52) U.S. Cl. .......... 704/500; 704/203; 704/204
(58) Field of Classification Search .......... None
See application file for complete search history.

(56) References Cited

U.S. PATENT DOCUMENTS

| 7,242,710 B2 | 7/2007 | Ekstrand |
| 2008/0249765 A1 | 10/2008 | Schuijers |
| 2008/0263285 A1 | 10/2008 | Sharma et al. |

FOREIGN PATENT DOCUMENTS

| WO | WO2008049589 A1 | 5/2008 |
| WO | WO2008146263 A2 | 12/2008 |

OTHER PUBLICATIONS

Chivukula, et al.: "Fast algorithms for MDCT and Low Delay Filterbanks Used in Audio Coding," Master of Science in Engineering [Online] (Aug. 8, 2008) Department of Electrical Engineering, The University of Texas at Arlington, Retrieved from the Internet: URL:http://dspace.uta.edu/handle/10106/921 [retrieved on Dec. 9, 2008].
Dietz, et al., "Spectral Band Replication, a Novel Approach in Audio Coding", Convention Paper 5553, 112th Convention of the AES, Munich, Germany, May 10-13, 2002.
Heideman, "Computation of an Odd-Length DCT from a Real-Valued DFT of the Same Length," IEEE Trans. Signal Proc., vol. 40. No. 1, Jan. 1992.
Hsu Han-Wen, et al., "Fast Complex Quadrature Mirror Filterbanks for MPEG-4 HE-AAC" AES Convention 121; AES, 60 East 42ND Street, Room 2520 New York 10165-2520, USA, Oct. 1, 2006, XP040507794 section 1 section 2.3.1 section 3.1
Huang, et al., "Fast Decomposition of Filterbanks for the State-of-the-Art Audio Coding", IEEE Signal Processing Letters, vol. 12, No. 10, pp. 693-696, Oct. 2005.
International Search report—PCT/US2010/031089, International Search Authority—European Patent Office, Jul. 7, 2010.

(Continued)

*Primary Examiner* — Talivaldis Ivars Smits
(74) *Attorney, Agent, or Firm* — Espartaco Diaz Hidalgo

(57) ABSTRACT

A complex analysis filterbank is implemented by obtaining an input audio signal as a plurality of N time-domain input samples. Pair-wise additions and subtractions of the time-domain input samples is performed to obtain a first and second groups of intermediate samples, each group having N/2 intermediate samples. The signs of odd-indexed intermediate samples in the second group are then inverted. A first transform is applied to the first group of intermediate samples to obtain a first group of output coefficients in the frequency domain. A second transform is applied to the second group of intermediate samples to obtain an intermediate second group of output coefficients in the frequency domain. The order of coefficients in the intermediate second group of output coefficients is then reversed to obtain a second group of output coefficients. The first and second groups of output coefficients may be stored and/or transmitted as a frequency domain representation of the audio signal.

104 Claims, 15 Drawing Sheets

OTHER PUBLICATIONS

ISO/IEC 14496-3:2005/FPDAM9, "Enhanced Low Delay AAC", San Jose, Apr. 2007.

ISO/IEC 14496-3:2009(E), Fourth edition Sep. 1, 2009, Information technology—Coding of audio-visual objects—Part 3: Audio, Subpart 4: 4.6.19 Low Delay SBR p. 269; 4.6.20 Enhanced Low Delay Codec, p. 276.

Kok, C.W.: "Fast Algorithm for Computing Discrete Cosine Transform," IEEE Transactions on Signal Processing, IEEE Service Center, New York, NY, US, vol. 45, No. 3, XP011057726 ISSN: 1053-587X, pp. 757-760 (Mar. 1, 1997).

Konstantinides, K., "Fast Subband Filtering in MPEG Audio Coding", Signal Proc. Letters, IEEE, vol. 1, No. 2, Feb. 1994, pp. 26-28.

Painter, et al., "Perceptual Coding of Digital Audio", Proc. IEEE, vol. 88, pp. 451-515, Apr. 2000.

Rao, K.R., "The Transform and Data Compression Handbook", chapter 4, CRC Press, Boca Raton, 2001.

Schnell, et al., "Enhanced MPEG-4 Low Delay AAC—Low Bitrate High Quality Communication", Convention Paper 6998, 122nd Convention of the AES, Vienna, Austria, May 5-8, 2007.

Schnell Markus, et al., "MPEG-4 Enhanced Low Delay AAC—A New Standard for High Quality Communication" AES Convention 125; AES, 60 East 42nd Street, Room 2520 New York 10165-2520, USA, Oct. 1, 2008, XP040508742 section 1 section 3 sections 4.1-4.3.

Silverman, H. F.: "An introduction to programming the Winograd Fourier transform algorithm (WFTA)," IEEE Transactions on Acoustics, Speech and Signal Processing, IEEE Inc. New York, USA, vol. 25, No. 2, pp. 152-165 (Apr. 1, 1977) XP002470750 ISSN: 0096-3518.

Tseng, et al., "Comments on "An Introduction to Programming the Winograd Fourier Transform Algorithm (WFTA)"", IEEE Trans. Acoustics, Speech and Signal Proc., vol. 26, No. 3, pp. 268-269, Jun. 1978.

Winograd, "On Computing the Discrete Fourier Transform", Mathematics of Computation, vol. 32, No. 141, pp. 175-199, Jan. 1978.

*COMPLEX SYNTHESIS FILTERBANK*

REAL ANALYSIS FILTERBANK

REAL ANALYSIS FILTERBANK

*REAL SYNTHESIS FILTERBANK* ional Application for Patent claims priority to U.S.

LOW COMPLEXITY SPECTRAL BAND REPLICATION (SBR) FILTERBANKS

CLAIM OF PRIORITY UNDER 35 U.S.C. §119

The present Application for Patent claims priority to U.S. Provisional Application No. 61/169,132 entitled "Fast SBR filterbanks for AAC-ELD, HE-AAC, and USAC" filed Apr. 14, 2009, assigned to the assignee hereof and hereby expressly incorporated by reference herein.

BACKGROUND

1. Field

The following description generally relates to encoders and decoders and, in particular, to a computationally-efficient filterbank structure for MPEG family of audio codecs, such as High-Efficiency Advance Audio Coding (HE-AAC), Enhanced Low-Delay (ELD), Spatial Audio (SAOC) and Unified Speech and Audio (USAC) codecs.

2. Background

One goal of audio coding is to compress an audio signal into a desired limited information quantity while keeping as much as the original sound quality as possible. In an encoding process, an input audio signal in a time domain is transformed into a frequency domain audio signal, and a corresponding decoding process reverses such operation by transforming the frequency domain audio signal to an output audio signal in the time domain.

Audio codecs may be based on modeling the psychoacoustic characteristics of the human auditory system. For instance, the audio signal may be split into several frequency bands and the masking properties of the human ear may be used to remove psychoacoustical redundancies. Hence, audio codecs generally rely on transform coding techniques for compression. Audio codecs typically suitable for coding any generic audio material at low bit rates. Since audio codecs operate on longer frame lengths for good frequency selectivity and also since they generally use orthogonal filterbanks, their round-trip algorithmic delay is high, making them unsuitable for full-duplex communications. However, the need for high quality, low bit rate, full-duplex audio communication applications (such as audio and video conferencing) is growing.

MPEG standardized a low delay audio codec called MPEG-4 Advance Audio Coding (AAC)-Enhanced Low Delay (ELD) that attempts to improve coding efficiency while keeping the codec delay low enough for full-duplex communications. AAC is a wideband audio coding algorithm that exploits two primary coding strategies to reduce dramatically the amount of data needed to represent high-quality digital audio. First, signal components that are perceptually irrelevant are discarded and, second, redundancies in the coded audio signal are eliminated.

Coding efficiency is increased by using Spectral Band Replication (SBR). To minimize the delay introduced, a low-delay version of the analysis and synthesis SBR filterbanks is used. Often, these audio codecs may operate on mobile platforms where processing power and battery life are limited. Hence, there is a need for fast algorithms for the computationally intensive operations of an audio codec. Typically, filterbanks and transforms contribute a significant part of the computational complexity. For the low-delay SBR (LD-SBR) filterbanks used in AAC-ELD, the corresponding matrix multiplication operation may be one of the most computationally intensive parts.

Thus, a computationally efficient filterbank is needed to reduce computational complexity and/or delay in audio codecs.

SUMMARY

The following presents a simplified summary of one or more embodiments in order to provide a basic understanding of some embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An encoding method and/or device are provided for computing transform values. Time-domain input values representing an audio signal are received. The time-domain input values may be transformed into frequency-domain (e.g., real and imaginary components) output values using, for example, a Discrete Cosine Transform (DCT).

A decoding method and/or device are provided for computing transform values. Spectral coefficients representing an audio signal are received. The spectral coefficients may be transformed into time-domain output values using, for example, an Inverse Discrete Cosine Transform (IDCT).

Discrete Cosine Transforms are practically important, in part, because they allow very efficient computations by means of factorization of their transform matrices. Thus, if multiplication of a N-point vector by a general N×N matrix requires $O(N^2)$ multiplications and additions, then computation of a product of a vector by a properly factorized DCT matrix usually requires only $O(N \log N)$ multiplications and/or additions.

In practice, Discrete Cosine Transform of type II and DCT of type IV are most commonly used or implemented. The DCT of type IV has an additional advantage of being involutary, that is, having the same transform matrix for both forward and inverse transforms. Although DCT-II and/or DCT-IV are convenient, in practice, the need often arises to implement filterbanks which basis functions are not exactly conformant to ones of DCT-II or DCT-IV. This happens, for example, in the design of low-delay filterbanks, such as ones in SBR filterbanks of AAC-ELD or HE-AAC, or SAOC codecs. Consequently, a technique is herein disclosed that allows computing a class of SBR filterbanks for various codecs by using DCT-II or DCT-IV transforms. Such computation leads to significant reduction of complexity of SBR filterbanks.

A method and/or apparatus are provided for implementing a filterbank, such as a complex analysis filterbank. An input audio signal is obtained as a plurality of N time-domain input samples. Pair-wise additions and subtractions are then performed of the time-domain input samples to obtain a first group and second group of intermediate samples, each group having N/2 intermediate samples. The first group of output coefficients may consists of real coefficients and the second group of output coefficients may consists of imaginary coefficients. The signs of odd-indexed intermediate samples in the second group are then inverted. A first transform is applied to the first group of intermediate samples to obtain a first group of output coefficients in the frequency domain. A second transform is applied to the second group of intermediate samples to obtain an intermediate second group of output coefficients in the frequency domain. The first and second transforms may operate concurrently to transform the first and second groups of intermediate samples. The first transform and second transform may both be Discrete Cosine Transform (DCT) type IV transforms. The analysis filterbank may be represented by an equation having a factor of (2n±x) in the numerator, where x is an odd number. The order of coefficients in the intermediate second group of output coefficients is reversed to obtain a second group of output coefficients. The time-domain input samples used may be samples in a real domain while the frequency domain may be a complex domain. In various implementations, the filterbank may be, for example, an Analysis Quadrature Mirror Filterbank, part of an audio encoder and/or decoder, and/or part of a Spectral Band Replication (SBR) encoder and/or decoder. The audio encoder and/or decoder may implement at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

A method and/or apparatus are provided for implementing a filterbank, such as a complex synthesis filterbank. A plurality of N input coefficients may be obtained for an audio signal in the frequency domain, where a first group of N/2 input coefficients are real components and a second group of N/2 input coefficients are imaginary components, wherein the sign of odd-indexed samples in the second group is inverted relative to the even indexed coefficients in the second group. The first group of input coefficients may consist of real coefficients and the second group of input coefficients may consist of imaginary coefficients. A first inverse transform may be applied to the first group of input coefficients to obtain an intermediate first group of output samples in the time-domain. A second inverse transform may be applied to the second group of input coefficients to obtain an intermediate second group of output samples in the time-domain. The first and second inverse transforms may operate concurrently to transform the first and second groups of input coefficients. The first inverse transform and second inverse transform may both Inverse Discrete Cosine Transform (IDCT) type IV transforms. The filterbank may be represented by an equation having a factor of (2n±x) in the numerator, where x is an odd number. Pair-wise subtractions may be performed of the intermediate second group of input coefficients from the intermediate first group of input coefficients to obtain a plurality of N time-domain output samples. The frequency domain may be a complex domain while the time-domain samples are samples in a real domain. In various implementations, the filterbank may be, for example, a Synthesis Quadrature Mirror Filterbank, part of an audio decoder, and/or part of a Spectral Band Replication (SBR) decoder. The audio decoder may implement at least one of a MPEG-4 Advance Audio Coding (AAC)-Low Delay (ELD) standard, a MPEG-4 AAC-Enhanced Low Delay (ELD) standard, and a MPEG-4 MPEG-4 High Efficiency (HE)-AAC standard.

A method and/or apparatus are provided for implementing a filterbank, such as a real analysis filterbank. An input audio signal is obtained as a plurality of N time-domain input samples. Pair-wise additions and subtractions of the time-domain input samples may be performed to obtain a group of N/2 intermediate samples. A transform may be applied to the group of N/2 intermediate samples to obtain N/2 output coefficients in the frequency domain. Both the time-domain input samples and frequency domain coefficients may be real numbers. The transform may be a Discrete Cosine Transform (DCT) type IV transform. The filterbank may be represented by an equation having a factor of (2n±x) in the numerator, where x is an odd number. The filterbank may be, for example, an Analysis Quadrature Mirror Filterbank. part of an audio encoder and/or decoder, and/or part of a Spectral Band Replication (SBR) encoder and/or decoder. The audio encoder and/or decoder may implement least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

A method and/or apparatus are provided for implementing a filterbank, such as a real synthesis filterbank. A plurality of N/2 input coefficients are obtained for an audio signal in the frequency domain. An inverse transform is applied to the group of N/2 input coefficients to obtain an intermediate group of N output samples in the time-domain. Replication, sign inversion, and reordering of coefficients may be performed on the intermediate group of N input coefficients to obtain a plurality of N time-domain output samples. Both input coefficients and time-domain output samples may be real numbers (i.e., real domain). The inverse transform is a Discrete Cosine Transform (DCT) type IV transform. The filterbank is represented by an equation having a factor of (2n±x) in the numerator, where x is an odd number. In various implementations, the filterbank may be, for example, a Synthesis Quadrature Mirror Filterbank, part of an audio decoder, and/or part of a Spectral Band Replication (SBR) decoder. The audio decoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

BRIEF DESCRIPTION OF THE DRAWINGS

Various features, nature, and advantages may become apparent from the detailed description set forth below when taken in conjunction with the drawings in which like reference characters identify correspondingly throughout.

DETAILED DESCRIPTION

Figure 1:
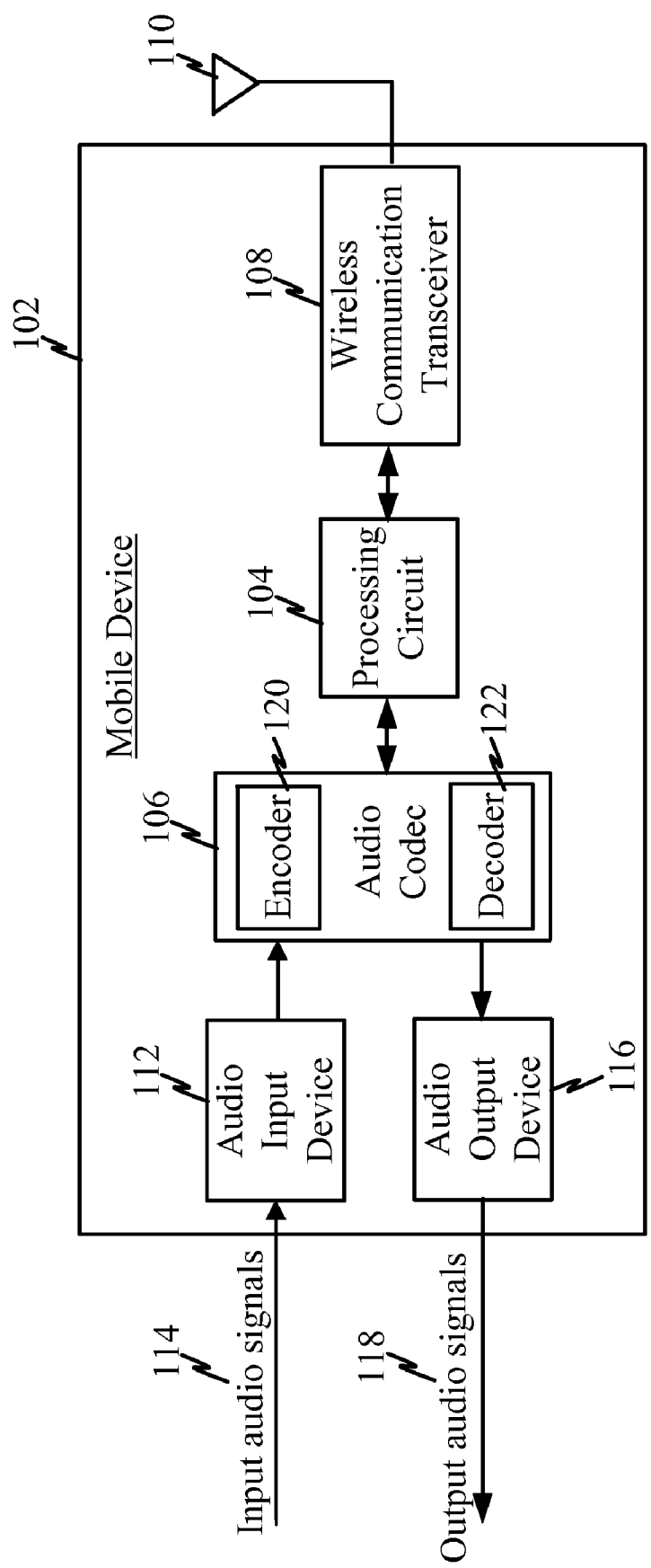
FIG. 1 is a block diagram illustrating an example of a mobile device adapted for communications over a wireless network.

Various embodiments are now described with reference to the drawings, wherein like reference numerals are used to refer to like elements throughout. In the following description, for purposes of explanation, numerous specific details arc set forth in order to provide a thorough understanding of one or more embodiments. It may be evident, however, that such embodiment(s) may be practiced without these specific details. In other instances, well-known structures and devices are shown in block diagram form in order to facilitate describing one or more embodiments.

Exemplary Mobile Device with Audio Codec

FIG. 1 is a block diagram illustrating an example of a mobile device adapted for communications over a wireless network. The mobile device 102 may include a processing circuit 104 coupled to an audio codec 106 and a wireless communication transceiver 108. The wireless communication transceiver 108 allows the mobile device to transmit and/or receive communications over-the-air through an antenna 110. The audio codec 106 may be coupled to an audio input device 112 (e.g., microphone) to receive input audio signals 114 and an audio output device 116 (e.g., one or more speakers) to output audio signals 118.

In various examples, the audio codec 106 may include an encoder 120 adapted to receive a time-domain input audio signal and efficiently encode it by transforming the time-domain input audio signal into a frequency-domain output signal. The frequency-domain output signal may then be stored by the mobile device, played back by the mobile device via audio output device 116 and/or transmitted over the wireless communication transceiver 108. Additionally, the audio codec 106 may also include a decoder 122 adapted to decode a frequency-domain audio signal by transforming it into a reconstructed time-domain audio signal. The reconstructed time-domain audio signal may then be played back by the mobile device via audio output device 116. In various examples, the audio codec 106 may be configured to operate according to the MPEG AAC-Enhanced Low Delay (ELD) standard and/or MPEG High Efficiency (HE)-AAC standard, among others.

According to one feature, the audio codec 106 may include an efficient implementation of an encoder and/or decoder.

Exemplary Encoder Structure

Figure 2:
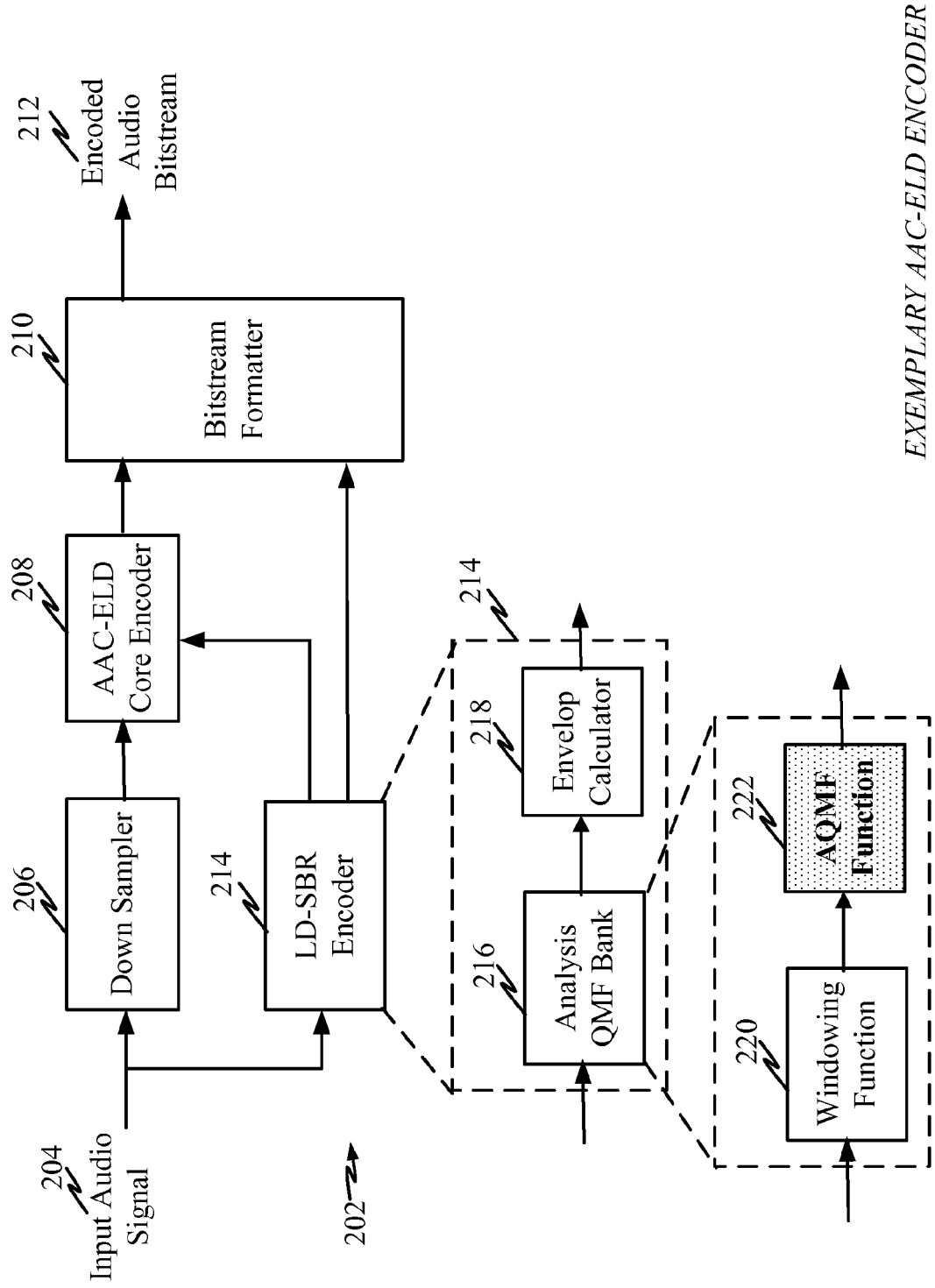
FIG. 2 is a block diagram illustrating an example of an AAC-ELD encoder that may include an efficient analysis filterbank.

FIG. 2 is a block diagram illustrating an example of an AAC-ELD encoder that may include an efficient analysis filterbank. The AAC-ELD encoder 202 may receive an input audio signal 204. A down sampler 206 may down sample the input audio signal 204 to reduce its sampling rate. The downsampled input audio signal 204 the passes to an AAC-ELD core encoder 208 that compresses the audio signal which is then formatted into a bitstream by the bitstream formatter 210 to generate an encoded audio bitstream 212.

In addition to the AAC encoder 208, the encoder 202 may also include a low-delay (LD) Spectral Band Replication (SBR) encoder 214. Spectral band replication may be used to enhance audio or speech codecs, especially at low bit rates and is based on harmonic redundancy in the frequency domain. SBR can be combined with any audio compression codec: the codec itself transmits the lower and mid-frequencies of the spectrum, while SBR replicates higher frequency content by transposing up harmonics from the lower and mid-frequencies at the decoder. Some guidance information for reconstruction of the high-frequency spectral envelope is transmitted as side information by the encoder 202. SBR may operate in a complex-value domain to avoid an aliasing effect, and hence may results in considerable time delays.

The SBR encoder 214 may include an Analysis Quadrature Mirror Filterbank (QMF) 216 and an envelop calculator 218. In turn, the Analysis QMF Bank 216 may implement a windowing function 220 and an Analysis QMF (AQMF) Function 222. Depending on the application, and its allowed power usage, the AAC-ELD encoder may instruct the SBR encoder 214 to operate in the complex-value domain or real-value domain. In both cases, the corresponding real or complex-domain analysis filterbank may be implemented by the AQMF Function 222.

Exemplary Decoder Structure

Figure 3:
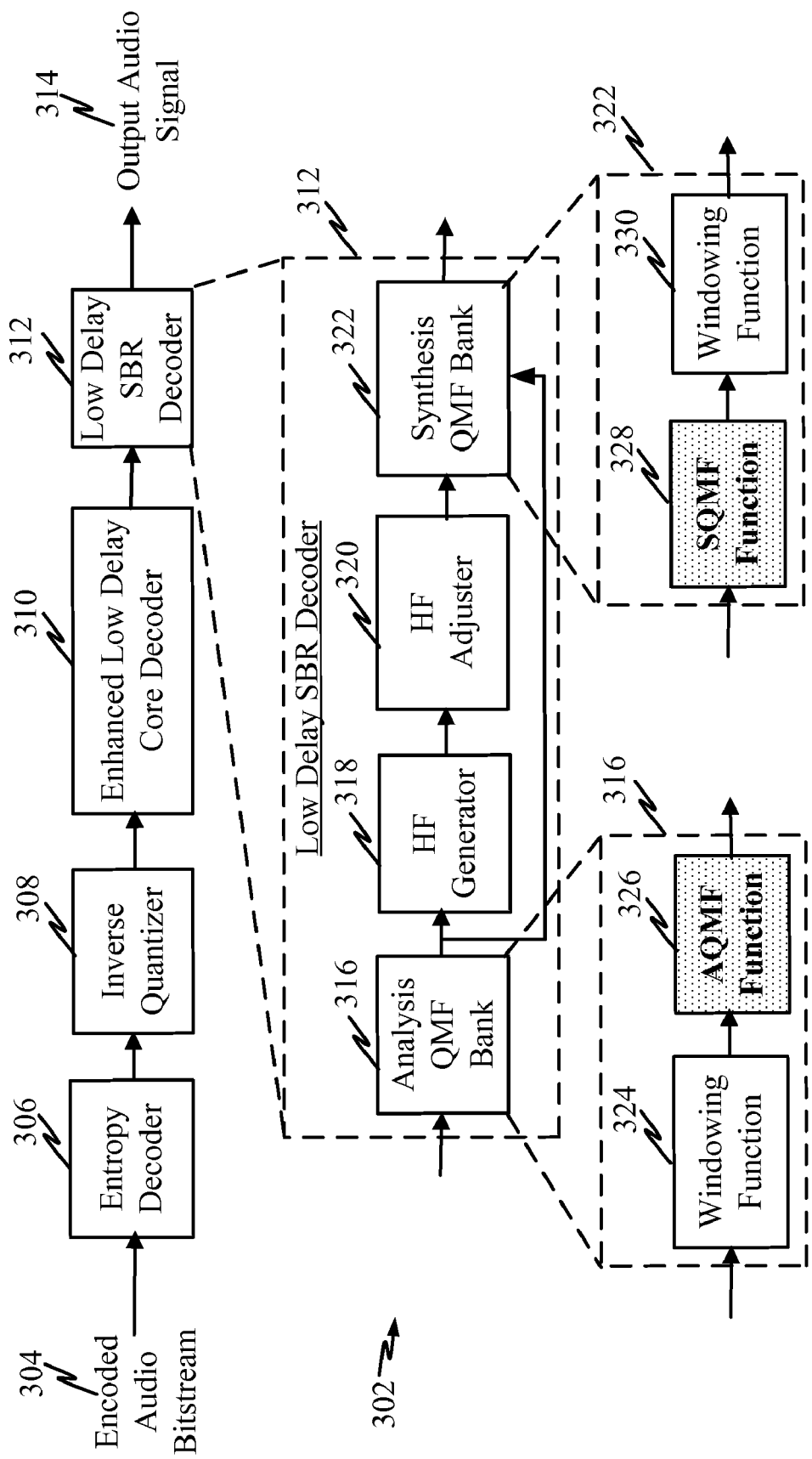
FIG. 3 is a block diagram illustrating an example of an AAC-ELD decoder that may include an efficient analysis filterbank and/or an efficient synthesis filterbank.

FIG. 3 is a block diagram illustrating an example of an AAC-ELD decoder that may include an efficient analysis filterbank and/or an efficient synthesis filterbank. The AAC-ELD decoder 302 may receive an encoded audio bitstream 304. An entropy decoder 306, inverse quantizer 308, and enhanced low delay core decoder 310 may then process the encoded audio bitstream 304 to reconstruct an output audio signal 314. As part of reconstructing the output audio signal 314, a low delay SBR decoder 312 may process the resulting signal from the enhanced low delay core decoder 310.

The SBR decoder 312 may include an Analysis Quadrature Mirror Filterbank (QMF) 316, a high frequency generator 318, a high frequency adjuster 320, and a synthesis QMF bank 322. In turn, the Analysis QMF Bank 116 may implement a windowing function 324 and an Analysis QMF (AQMF) Function 326. To address the time delays associated with the SBR decoder 312 operating in the complex-value domain or real-value domain, an efficient analysis filterbank may be implemented by the AQMF Function 326. In turn, the Synthesis QMF Bank 322 may implement a Synthesis QMF (SQMF) Function 328 and a windowing function 330. Depending on the complexity of the decoder, the SBR decoder 312 may operate in the complex-value domain or real-value domain. The corresponding real or complex domain synthesis filterbank may be implemented by the SQMF Function 328. Furthermore, if due to complexity or application requirements it is reasonable to synthesize only half of the nominal frequency band, the decoder may implement a Downsampled Synthesis Filterbank by the SQMF Function 328.

Low Delay SBR Filterbanks

There are two types of low-delay SBR filterbanks defined in AAC-ELD:

the complex low-delay filterbank (CLDFB), and real (or low-complexity) low-delay filterbank.

where the complex low delay filterbank is intended for use in applications requiring best possible audio quality at any given bitrate, while the low-complexity low-delay filterbank is intended to be a lower-complexity version, that still produces acceptable results (i.e., in terms of quality/rate).

The SBR complex low delay filterbank (CLDFB) operations are defined as follows (ignoring the normalization factors):

Complex Analysis QMF:

$$X(k) = \sum_{n=0}^{63} x(n)\exp\left\{\frac{i\pi(k+0.5)(2n-95)}{64}\right\}, \quad \text{(Equation 1)}$$

$$k = 0, \ldots, 31$$

Complex Synthesis QMF:

$$\tilde{x}(n) = \text{Re}\left[\sum_{k=0}^{63} \tilde{X}(k)\exp\left\{\frac{i\pi(k+0.5)(2n-63)}{128}\right\}\right], \quad \text{(Equation 2)}$$

$$n = 0, \ldots, 127$$

Complex Downsampled Synthesis QMF:

$$\hat{x}(n) = \text{Re}\left[\sum_{k=0}^{31} \hat{X}(k)\exp\left\{\frac{i\pi(k+0.5)(2n-31)}{64}\right\}\right], \quad \text{(Equation 3)}$$

$$n = 0, \ldots, 63$$

where $i=\sqrt{-1}$, and $x(n), \tilde{x}(n), \hat{x}(n) \in \mathbb{R}$; $X(k), \tilde{X}(k), \hat{X}(k) \in \mathbb{C}$.

The real analysis and synthesis filterbanks in AAC-ELD are also defined, as follows:

Real Analysis QMF:

$$X_R(k) = \sum_{n=0}^{63} x(n)\cos\left\{\frac{\pi(k+0.5)(2n-95)}{64}\right\}, \quad \text{(Equation 4)}$$

$$k = 0, \ldots, 31$$

Real Synthesis QMF:

$$\tilde{x}_R(n) = \sum_{k=0}^{63} \tilde{X}_R(k)\cos\left\{\frac{\pi(k+0.5)(2n-63)}{128}\right\}, \quad \text{(Equation 5)}$$

$$n = 0, \ldots, 127$$

Real Downsampled Synthesis QMF:

$$\hat{x}_R(n) = \sum_{k=0}^{31} \hat{X}_R(k)\cos\left\{\frac{\pi(k+0.5)(2n-31)}{64}\right\}, \quad \text{(Equation 6)}$$

$$n = 0, \ldots, 63$$

The DCT-IV transform of size N, is defined as follows:

$$X(k) = \sum_{n=0}^{N} x(n)\cos\left\{\frac{\pi(2k+1)(2n+1)}{4N}\right\} \quad \text{(Equation 7)}$$

According to one aspect, the filterbanks of Equations 1-6 are factorized such that their essential matrix-vector product operations turn into Equation 7.

Mapping for Complex Analysis QMF

In mapping the Complex Analysis QMF of Equation 1 to the DCT-IV transform of Equation 7, Equation 1 may be represented as:

$$X(k) = \sum_{n=0}^{63} x(n)\exp\left\{\frac{i\pi(2k+1)(2n-95)}{128}\right\}, \quad \text{(Equation 8)}$$

$$k = 0, \ldots, 31$$

Let $p=n-48$. Then $X(k)$ may be split as follows:

$$X(k) = \sum_{p=-48}^{15} x(p+48)\exp\left\{\frac{i\pi(2k+1)(2p+1)}{128}\right\} \quad \text{(Equation 9)}$$

$$= \sum_{p=-48}^{-1} x(p+48)\exp\left\{\frac{i\pi(2k+1)(2p+1)}{128}\right\} +$$

$$\sum_{p=0}^{15} x(p+48)\exp\left\{\frac{i\pi(2k+1)(2p+1)}{128}\right\}.$$

Let now $n=p+64$ in the summation. Then:

$$X(k) = \sum_{n=16}^{63} x(n-16)\exp\left\{\frac{i\pi(2k+1)(2n+1-128)}{128}\right\} + \quad \text{(Equation 10)}$$

$$\sum_{n=0}^{15} x(n+48)\exp\left\{\frac{i\pi(2k+1)(2n+1)}{128}\right\}$$

$$= \sum_{n=16}^{63} -x(n-16)\exp\left\{\frac{i\pi(2k+1)(2n+1)}{128}\right\} +$$

$$\sum_{n=0}^{15} x(n+48)\exp\left\{\frac{i\pi(2k+1)(2n+1)}{128}\right\}.$$

where $x'(n)$ may be defined as two components:

$$x'(n) = \begin{cases} x(n+48) & n = 0, \ldots, 15 \\ -x(n-16) & n = 16, \ldots, 63. \end{cases} \quad \text{(Equation 11)}$$

Then $X(k)$ may be represented as:

$$X(k) = \sum_{n=0}^{63} x'(n)\exp\left\{\frac{i\pi(2k+1)(2n+1)}{128}\right\}. \quad \text{(Equation 12)}$$

Next, $X(k)$ may be further split as:

$$X(k) = \sum_{n=0}^{31} x'(n)\exp\left\{\frac{i\pi(2k+1)(2n+1)}{128}\right\} + \quad \text{(Equation 13)}$$

$$\sum_{n=32}^{63} x'(n)\exp\left\{\frac{i\pi(2k+1)(2n+1)}{128}\right\}.$$

Next, n may be replaced by 63−n in the second summation, producing $$X(k) = \sum_{n=0}^{31} x'(n)\exp\left\{\frac{i\pi(2k+1)(2n+1)}{128}\right\} + \quad \text{(Equation 14)}$$

$$\sum_{n=0}^{31} x'(63-n)\exp\left\{\frac{i\pi(2k+1)\left(\begin{array}{c}128-\\(2n+1)\end{array}\right)}{128}\right\}$$

$$= \sum_{n=0}^{31} x'(n)\exp\left\{\frac{i\pi(2k+1)(2n+1)}{128}\right\} +$$

$$\sum_{n=0}^{31} -x'(63-n)\exp\left\{-\frac{i\pi(2k+1)(2n+1)}{128}\right\}$$

$$= \sum_{n=0}^{31} \left\{\begin{array}{c} x'(n) - \\ x'(63-n)\end{array}\right\}\cos\left\{\frac{\pi(2k+1)(2n+1)}{128}\right\} +$$

$$i\sum_{n=0}^{31} \left\{\begin{array}{c} x'(n) + \\ x'(63-n)\end{array}\right\}\sin\left\{\frac{\pi(2k+1)(2n+1)}{128}\right\}.$$

Additionally, $x_1(n)$ and $x_2(n)$ may be defined as:

$$\begin{array}{l} x_1(n) = x'(n) - x'(63-n) \\ x_2(n) = x'(n) + x'(63-n) \end{array} \quad \text{(Equation 15)}$$

$$n = 0, \ldots, 31.$$

which by Equation 11 means that:

$$x_1(n) = \begin{cases} x(n+48) + x(47-n) & n = 0, \ldots, 15 \\ -x(n-16) + x(47-n) & n = 16, \ldots, 31 \end{cases} \quad \text{(Equation 16)}$$

$$x_2(n) = \begin{cases} x(n+48) - x(47-n) & n = 0, \ldots, 15 \\ -x(n-16) - x(47-n) & n = 16, \ldots, 31 \end{cases}$$

By inserting $x_1(n)$ and $x_2(n)$ into the resulting Equation 14, X(k) may be defined as:

$$X(k) = \sum_{n=0}^{31} x_1(n)\cos\left\{\frac{\pi(2k+1)(2n+1)}{128}\right\} + \quad \text{(Equation 17)}$$

$$i\sum_{n=0}^{31} x_2(n)\sin\left\{\frac{\pi(2k+1)(2n+1)}{128}\right\}$$

$$k = 0, \ldots, 31.$$

Note that the first summation in Equation 17 is a 32-point Discrete Cosine Transform type IV (DCT-IV) and the second summation of Equation 17 is a 32-point Discrete Sine Transform type IV (DST-IV).

Further, the DST-IV can be mapped to a DCT-IV by input sign changes and output permutation. In other words, the two components of Equation 17 may be represented as $X_1(k)$ and $X_2(k)$ as follows:

$$X_1(k) = \sum_{n=0}^{31} x_1(n)\cos\left\{\frac{\pi(2k+1)(2n+1)}{128}\right\} \quad \text{(Equation 18)}$$

$$X_2(k) = \sum_{n=0}^{31} (-1)^n x_2(n)\cos\left\{\frac{\pi(2k+1)(2n+1)}{128}\right\},$$

where $X_2(k)$ is the DST-IV component that has been converted

Then X(k) may be represented as:

$$X(k) = X_1(k) + iX_2(31-k) \; k=0, \ldots, 31. \quad \text{(Equation 19)}$$

where computation of both parts are just DCT-IV transforms in the form of Equation 7.

Mapping for Complex Synthesis QMF

In mapping the Complex Synthesis QMF of Equation 2 to the DCT-IV transform of Equation 7, Equation 2 may be represented as:

$$\tilde{x}(n) = \text{Re}\left[\sum_{k=0}^{63} \tilde{X}(k)\exp\left\{\frac{i\pi(k+0.5)(2n-63)}{128}\right\}\right], \quad \text{(Equation 20)}$$

$$n = 0, \ldots, 127.$$

Let $\tilde{X}(k)$ be represented as:

$$\tilde{X}(k) = \tilde{X}_R(k) + i\tilde{X}_I(k). \quad \text{(Equation 21)}$$

Then:

$$\tilde{x}(n) = \sum_{k=0}^{63} \tilde{X}_R(k)\cos\left\{\frac{\pi(2k+1)(2n-63)}{256}\right\} - \quad \text{(Equation 22)}$$

$$\sum_{k=0}^{63} \tilde{X}_I(k)\sin\left\{\frac{\pi(2k+1)(2n-63)}{256}\right\}.$$

The real and imaginary components of $\tilde{x}(n)$ may be represented as $\tilde{x}_1(n)$ and $\tilde{x}_2(n)$:

$$\tilde{x}_1(n) = \sum_{k=0}^{63} \tilde{X}_R(k)\cos\left\{\frac{\pi(2k+1)(2n-63)}{256}\right\} \quad \text{(Equation 23)}$$

$$\tilde{x}_2(n) = \sum_{k=0}^{63} \tilde{X}_I(k)\sin\left\{\frac{\pi(2k+1)(2n-63)}{256}\right\}$$

$$n = 0, \ldots, 127.$$

That is $\tilde{x}(n)$ may be represented as:

$$\tilde{x}(n) = \tilde{x}_1(n) - \tilde{x}_2(n). \quad \text{(Equation 24)}$$

Next, $\tilde{x}_1(n)$ may be split and represented as:

$$\tilde{x}_{11}(n) = \begin{cases} \tilde{x}_1(n+32) & n=0,\ldots,95 \\ \tilde{x}_1(n-96) & n=96,\ldots,127. \end{cases} \quad \text{(Equation 25)}$$

So, for n=0, ..., 95:

$$\tilde{x}_{11}(n) = \tilde{x}_1(n+32) \quad \text{(Equation 26)}$$

$$= \sum_{k=0}^{63} \tilde{X}_R(k)\cos\left\{\frac{\pi(2k+1)(2n+1)}{256}\right\}.$$

And for n=96, ..., 127:

$$\tilde{x}_{11}(n) = x_1(n-96) \quad \text{(Equation 27)}$$

$$= -\sum_{k=0}^{63} \tilde{X}_R(k)\cos\left\{\frac{\pi(2k+1)(2n+1)}{256}\right\}.$$

Now consider $\tilde{x}_{11}(64+n)$, and $\tilde{x}_{11}(63-n)$, for n=0, ..., 31.

$$\tilde{x}_{11}(64+n) = \sum_{k=0}^{63} \tilde{X}_R(k)\cos\left\{\frac{\pi(2k+1)}{2} + \frac{\pi(2k+1)(2n+1)}{256}\right\} \quad \text{(Equation 28)}$$

$$= -\sum_{k=0}^{63} (-1)^k \tilde{X}_R(k)\sin\left\{\frac{\pi(2k+1)(2n+1)}{256}\right\}$$

and $$\tilde{x}_{11}(63-n) = \sum_{k=0}^{63} \tilde{X}_R(k)\cos\left\{\frac{\pi(2k+1)}{2} - \frac{\pi(2k+1)(2n+1)}{256}\right\} \quad \text{(Equation 29)}$$

$$= \sum_{k=0}^{63} (-1)^k \tilde{X}_R(k)\sin\left\{\frac{\pi(2k+1)(2n+1)}{256}\right\}$$

From the above two results of Equations 28 and 29 note that, $$\tilde{x}_{11}(64+n) = -\tilde{x}_{11}(63-n), \text{ for } n=0,\ldots,31. \quad \text{(Equation 30)}$$

For n=32, ..., 63, also have:

$$\tilde{x}_{11}(64+n) = -\sum_{k=0}^{63} \tilde{X}_R(k)\cos\left\{\frac{\pi(2k+1)}{2} + \frac{\pi(2k+1)(2n+1)}{256}\right\} \quad \text{(Equation 31)}$$

$$= \sum_{k=0}^{63} (-1)^k \tilde{X}_R(k)\sin\left\{\frac{\pi(2k+1)(2n+1)}{256}\right\}$$

$$= \tilde{x}_{11}(63-n)$$

From the two results of Equations 30 and 31, it is now clear that $\tilde{x}_{11}(n)$ may be calculated for only for n=0, ..., 63. The remaining values can be obtained from the relations:

$$\tilde{x}_{11}(64+n) = -\tilde{x}_{11}(63-n), \text{ for } n=0,\ldots,31. \quad \text{(Equation 32)}$$

and $$\tilde{x}_{11}(64+n) = \tilde{x}_{11}(63-n), \text{ for } n=32,\ldots,63 \quad \text{(Equation 33)}$$

Also note that $\tilde{x}_{11}(n)$ for n=0, ..., 63 is a 64-point DCT-IV transform.

By combining all these observations, the following algorithm for computing $\tilde{x}_1(n)$ is obtained:

$$\tilde{x}_1(n+32) = \tilde{x}_{11}(n) \quad \text{(Equation 34)}$$

$$= \sum_{k=0}^{63} \tilde{X}_R(k)\cos\left\{\frac{\pi(2k+1)(2n+1)}{256}\right\},$$

$$n = 0,\ldots,63,$$

$$\tilde{x}_1(n+96) = -\tilde{x}_1(95-n) \quad \text{(Equation 35)}$$
$$n = 0,\ldots,31,$$

$$\tilde{x}_1(n-32) = \tilde{x}_1(95-n) \quad \text{(Equation 36)}$$
$$n = 32,\ldots,63.$$

A similar factorization can be carried out for $\tilde{x}_2(n)$. This will result in a 64-point DST-IV transform which can be mapped to the DCT-IV transform of Equation 7 as done previously. The resulting algorithm is as follows:

$$\tilde{x}_2(95-n) = \sum_{k=0}^{63} (-1)^k \tilde{X}_I(k)\cos\left\{\frac{\pi(2k+1)(2n+1)}{256}\right\}, \quad \text{(Equation 37)}$$

$$n = 0,\ldots,63,$$

$$\tilde{x}_2(n+96) = \tilde{x}_2(95-n) \quad \text{(Equation 38)}$$
$$n = 0,\ldots,31,$$

$$\tilde{x}_2(n-32) = -\tilde{x}_2(95-n) \quad \text{(Equation 39)}$$
$$n = 32,\ldots,63.$$

Recalling Equation 24 ($\tilde{x}(n) = \tilde{x}_1(n) - \tilde{x}_2(n)$) and using the above equations, a $\tilde{x}(n)$ may be computed for the complex synthesis QMF.

Mapping for Complex Downsampled Synthesis QMF

The derivation for the Complex Downsampled Synthesis QMF from Equation 3 to the form of Equation 7 is similar to the derivations shown for Analysis QMF and Synthesis QMF. Let $$\hat{X}(k) = \hat{X}_R(k) + i\hat{X}_I(k). \quad \text{(Equation 40)}$$

Let also:

$$\hat{x}(n) = \hat{x}_1(n) - \hat{x}_2(n) \text{ for } n=0,\ldots,63. \quad \text{(Equation 41)}$$

Then:

$$\hat{x}_1(n+16) = \sum_{k=0}^{31} \hat{X}_R(k)\cos\left\{\frac{\pi(2k+1)(2n+1)}{128}\right\} \quad \text{(Equation 42)}$$

$$n = 0,\ldots,31$$

$$\hat{x}_1(n+48) = -\hat{x}_1(47-n) \quad \text{(Equation 43)}$$
$$n = 0,\ldots,15,$$

-continued $$\hat{x}_1(n-16) = \hat{x}_1(47-n) \quad \text{(Equation 44)}$$
$$n = 16, \ldots, 31.$$

and $$\hat{x}_2(47-n) = \sum_{k=0}^{31} (-1)^k \hat{X}_I \cos\left\{\frac{\pi(2k+1)(2n+1)}{128}\right\} \quad \text{(Equation 45)}$$
$$n = 0, \ldots, 31$$

$$\hat{x}_2(n+48) = \hat{x}_2(47-n) \quad \text{(Equation 46)}$$
$$n = 0, \ldots, 15,$$

$$\hat{x}_2(n-16) = -\hat{x}_2(47-n) \quad \text{(Equation 47)}$$
$$n = 16, \ldots, 31.$$

Mapping for Real Analysis QMF

The derivation for the Real Analysis QMF from Equation 4 to the form of Equation 7 is similar to the derivations shown for Complex Analysis QMF described above. The resulting filterbank equation for Real Analysis QMF is given as:

$$X_R(k) = \sum_{n=0}^{31} x_1(n)\cos\left\{\frac{\pi(2k+1)(2n+1)}{128}\right\} \quad \text{(Equation 48)}$$
$$k = 0, \ldots, 31$$

where:

$$x_1(n) = \begin{cases} x(n+48) + x(47-n) & n = 0, \ldots, 15 \\ -x(n-16) + x(47-n) & n = 16, \ldots, 31 \end{cases} \quad \text{(Equation 49)}$$

Mapping for Real Synthesis QMF

The derivation for the Real Synthesis QMF from Equation 5 to the form of Equation 7 is similar to the derivations shown for Complex Synthesis QMF described above. The resulting filterbank equation for Real Synthesis QMF is given as:

$$\tilde{x}_R(n+32) = \sum_{k=0}^{63} \tilde{X}_R(k)\cos\left\{\frac{\pi(2k+1)(2n+1)}{256}\right\} \quad \text{(Equation 50)}$$
$$n = 0, \ldots, 63,$$

$$\tilde{x}_R(n+96) = -\tilde{x}_R(95-n) \quad \text{(Equation 51)}$$
$$n = 0, \ldots, 31,$$

$$\tilde{x}_R(n-32) = \tilde{x}_R(95-n) \quad \text{(Equation 52)}$$
$$n = 32, \ldots, 63.$$

Mapping for Real Downsampled Synthesis QMF

The derivation for the Real Downsampled Synthesis QMF from Equation 6 to the form of Equation 7 is similar to the derivations shown for Complex Downsampled Synthesis QMF described above. The resulting filterbank equation for Real Downsampled Synthesis QMF is given as:

$$\hat{x}_R(n+16) = \sum_{k=0}^{31} \hat{X}_R(k)\cos\left\{\frac{\pi(2k+1)(2n+1)}{128}\right\} \quad \text{(Equation 53)}$$
$$n = 0, \ldots, 31,$$

$$\hat{x}_R(n+48) = -\hat{x}_R(47-n) \quad \text{(Equation 54)}$$
$$n = 0, \ldots, 15,$$

$$\hat{x}_R(n-16) = \hat{x}_R(47-n) \quad \text{(Equation 55)}$$
$$n = 16, \ldots, 31.$$

In all examples noted above, the filterbank computations are effectively reduced to computations of DCT-IV transforms of sizes N=32, or N=64.

Exemplary Factorization of Complex Analysis Filterbank

Note that the filterbanks of Equations 1, 2, 3, 4, 5, and 6 are odd phased or indexed, which means that the numerator of the SBR equation includes a factor (2n±x) where x is an odd number. In the examples of above, Equations 1 and 4 include (2n−95), the Equations 2 and 5 include (2n−63), and the Equations 3 and 6 include (2n−31). In practice, implementing these filterbanks in encoders/decoders is difficult due to their complexity which causes delays and require more processing resources.

Therefore, one feature transforms these SBR algorithms (e.g., Equations 1, 2, 3, 4, 5, and/or 6) so that they can be represented based on a core DCT-IV transform (e.g., Equation 7). That is, by implementing the SBR algorithms based on an efficient DCT-IV transform, the SBR algorithm can be executed more efficiently (e.g., requires less processing resources or can be performed more quickly).

Figure 4:
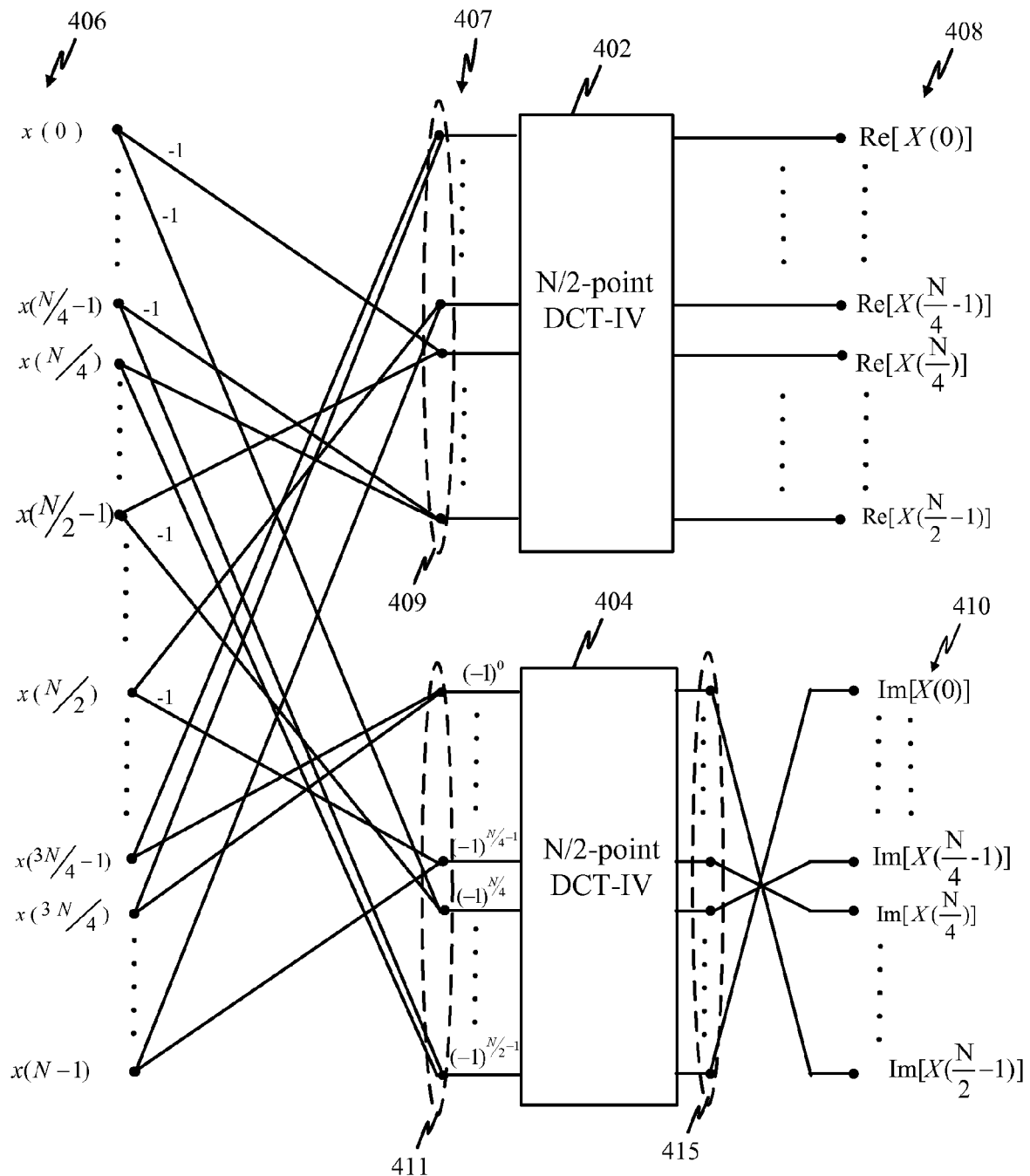
FIG. 4 illustrates an example of an efficient complex analysis filterbank.

FIG. 4 illustrates an example of an efficient complex analysis filterbank. An input audio signal is sampled into a plurality of time-domain input samples 406 (i.e., N-point samples). Pair-wise sums and subtractions 407 of the time-domain input samples (e.g., values) are taken to produce a first group 409 and second group 411 of intermediate samples, each group having N/2 intermediate samples. For the intermediate samples in the second group 411, the sign of odd-indexed samples is inverted (e.g., multiplied by $(-1)^n$, where n may be, for example, between 0 and N/2−1). A first DCT-IV transform 402 is applied to the first group 409 of intermediate samples to obtain a first group 408 of output coefficients in the frequency-domain. A second DCT-IV transform 404 is applied to the second group 411 of intermediate values to obtain an intermediate second group 415 of output coefficients in the frequency-domain. The order of the intermediate second group 415 of output coefficients is reversed to obtain a second group 410 of output coefficients. Thus, the time-domain signal input samples 406 are converted into the frequency domain (i.e., complex domain spectrum). Here, the resulting first group 408 of output coefficients represents a real part while the second group 410 of output coefficients represents an imaginary part.

Figure 5:
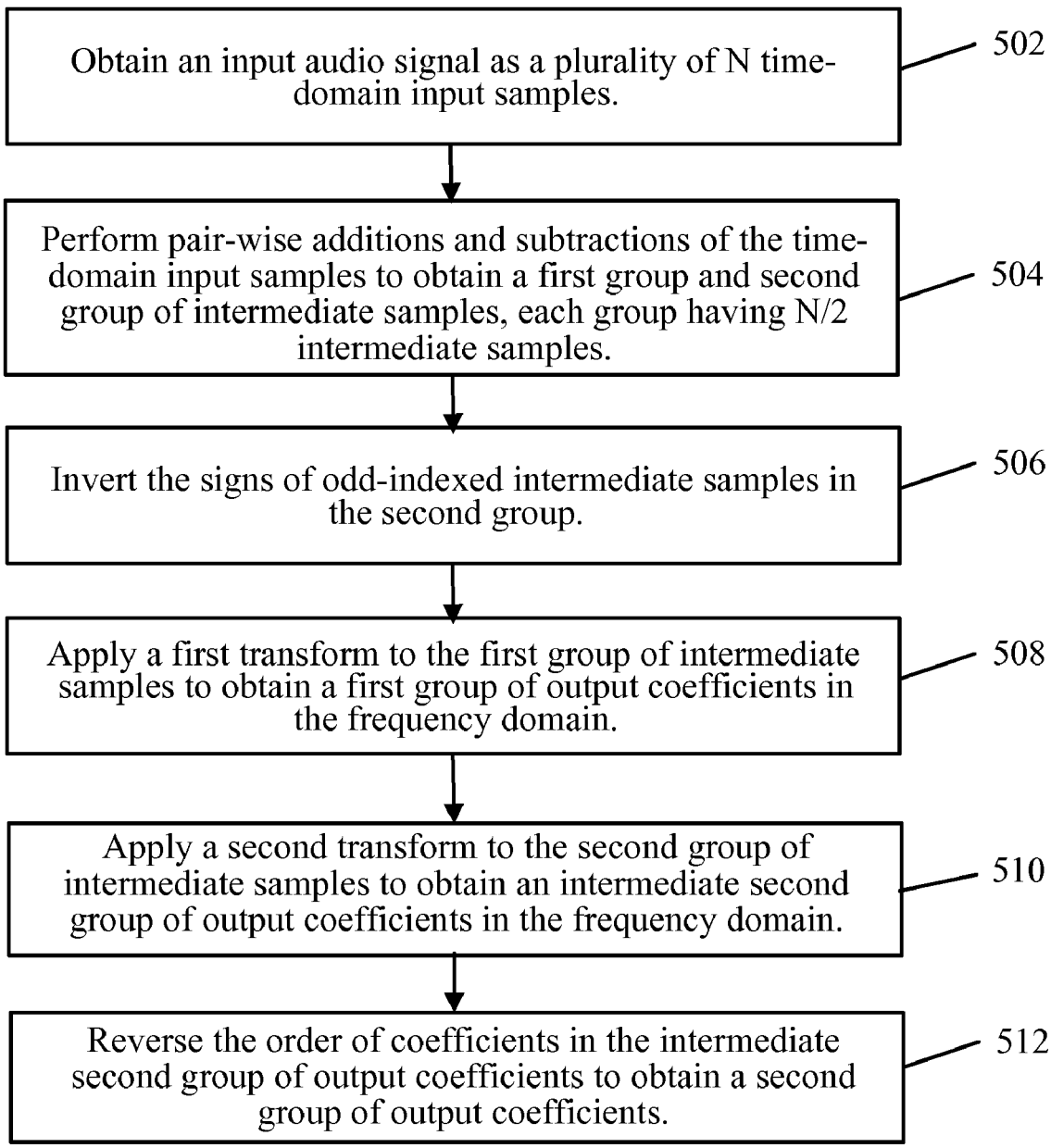
FIG. 5 illustrates a method for implementing an analysis filterbank according to one example.

FIG. 5 illustrates a method for implementing an analysis filterbank according to one example. An input audio signal may be obtained as a plurality of N time-domain input samples 502. Pair-wise additions and subtractions of the time-domain input samples may be performed to obtain a first group and second group of intermediate samples, each group having N/2 intermediate samples 504. The first group of output coefficients may consist of real coefficients and the second group of output coefficients consists of imaginary coefficients. The signs of odd-indexed intermediate samples in the second group may then be inverted 506. A first transform may be applied to the first group of intermediate samples to obtain a first group of output coefficients in the frequency domain 508. A second transform may be applied to the second group of intermediate samples to obtain an intermediate second group of output coefficients in the frequency domain 510.

The first transform and second transform may both be Discrete Cosine Transform (DCT) type IV transforms. The first and second transforms may operate concurrently to transform the first and second groups of intermediate samples. The order of coefficients in the intermediate second group of output coefficients may be reversed to obtain a second group of output coefficients 512. The time-domain input samples used may be samples in a real domain while the frequency domain is a complex domain.

In various implementations, the filterbank may be an Analysis Quadrature Mirror Filterbank, part of an audio encoder, part of a Spectral Band Replication (SBR) encoder/decoder, and/or part of an audio decoder. The audio encoder/decoder may implement at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

Figure 6:
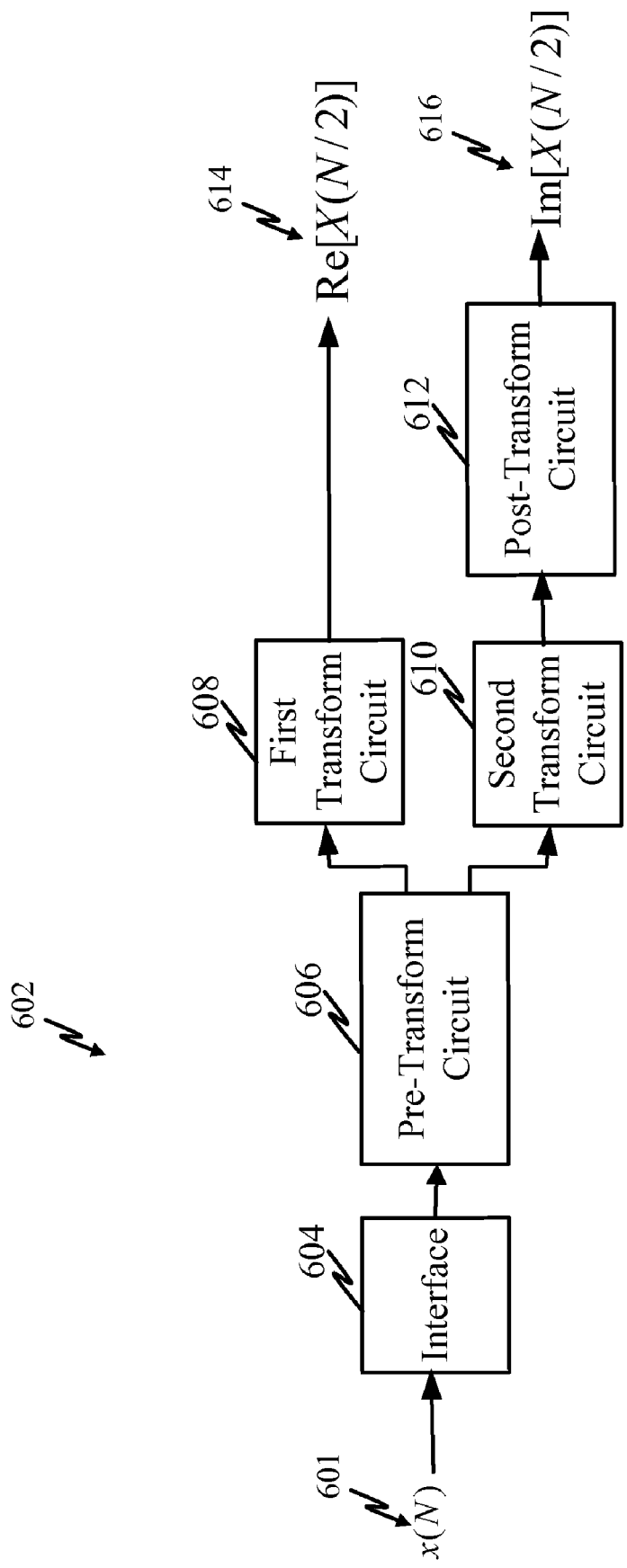
FIG. 6 is a block diagram illustrating function components for implementing an analysis filterbank according to one example.

FIG. 6 is a block diagram illustrating function components for implementing an analysis filterbank according to one example. The filterbank device may include an interface 604 adapted to obtain an input audio signal 601 as a plurality of N time-domain input samples. A pre-transform circuit 606 may then: (a) perform pair-wise additions and subtractions of the time-domain input samples to obtain a first group and second group of intermediate samples, each group having N/2 intermediate samples; and (b) invert the signs of odd-indexed intermediate samples in the second group. A first transform circuit 608 may then apply a first transform to the first group of intermediate samples to obtain a first group 614 of output coefficients in the frequency domain. A second transform circuit 610 may then apply a second transform to the second group of intermediate samples to obtain an intermediate second group of output coefficients in the frequency domain. A post-transform circuit 612 may then reverse the order of coefficients in the intermediate second group of output coefficients to obtain a second group 616 of output coefficients.

Exemplary Factorization of Complex Synthesis Filterbank

Figure 7:
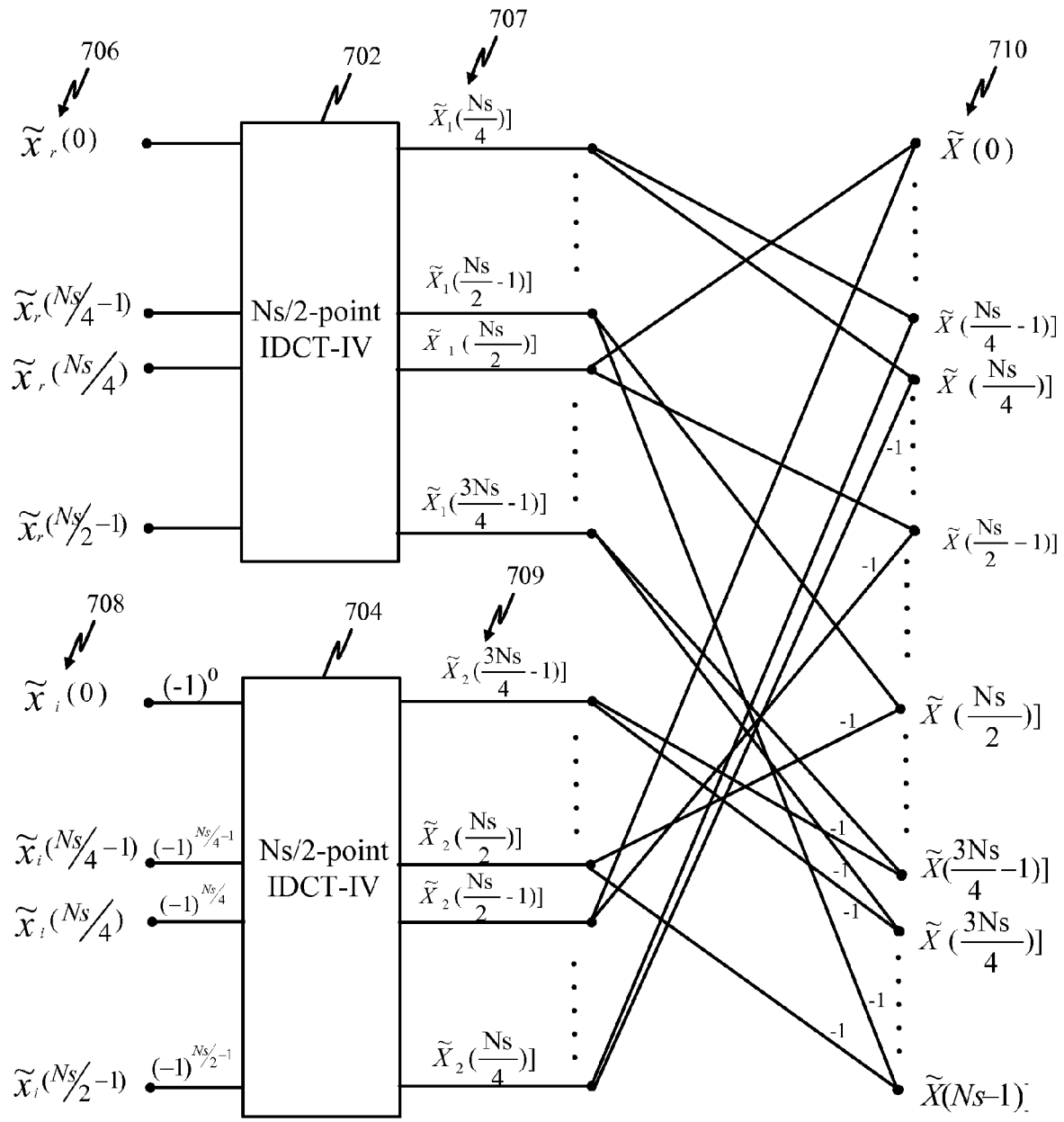
FIG. 7 illustrates an example of an efficient complex synthesis filterbank.

FIG. 7 illustrates an example of an efficient complex synthesis filterbank. Input coefficients in the frequency domain (e.g., complex-domain) are obtained, where a first group 706 of input coefficients are real components and a second group 708 of input coefficients are imaginary components. For the second group 708 of input coefficients, the sign of odd-indexed samples is inverted (e.g., multiplied by e.g., multiplied by $(-1)^n$, where n may be, for example, between 0 and N/2−1) relative to the even indexed coefficients. A first inverse DCT-IV transform 702 is applied to the first group 706 of input coefficients to obtain an intermediate first group 707 of output samples in the time-domain. A second inverse DCT-IV transform 704 is applied to the second group 708 of input coefficients to obtain an intermediate second group 709 of output samples in the time-domain. Pair-wise subtractions of the intermediate second group 709 from the intermediate first group 707 are then performed to obtain a time-domain output samples 710 (e.g., values).

Figure 8:
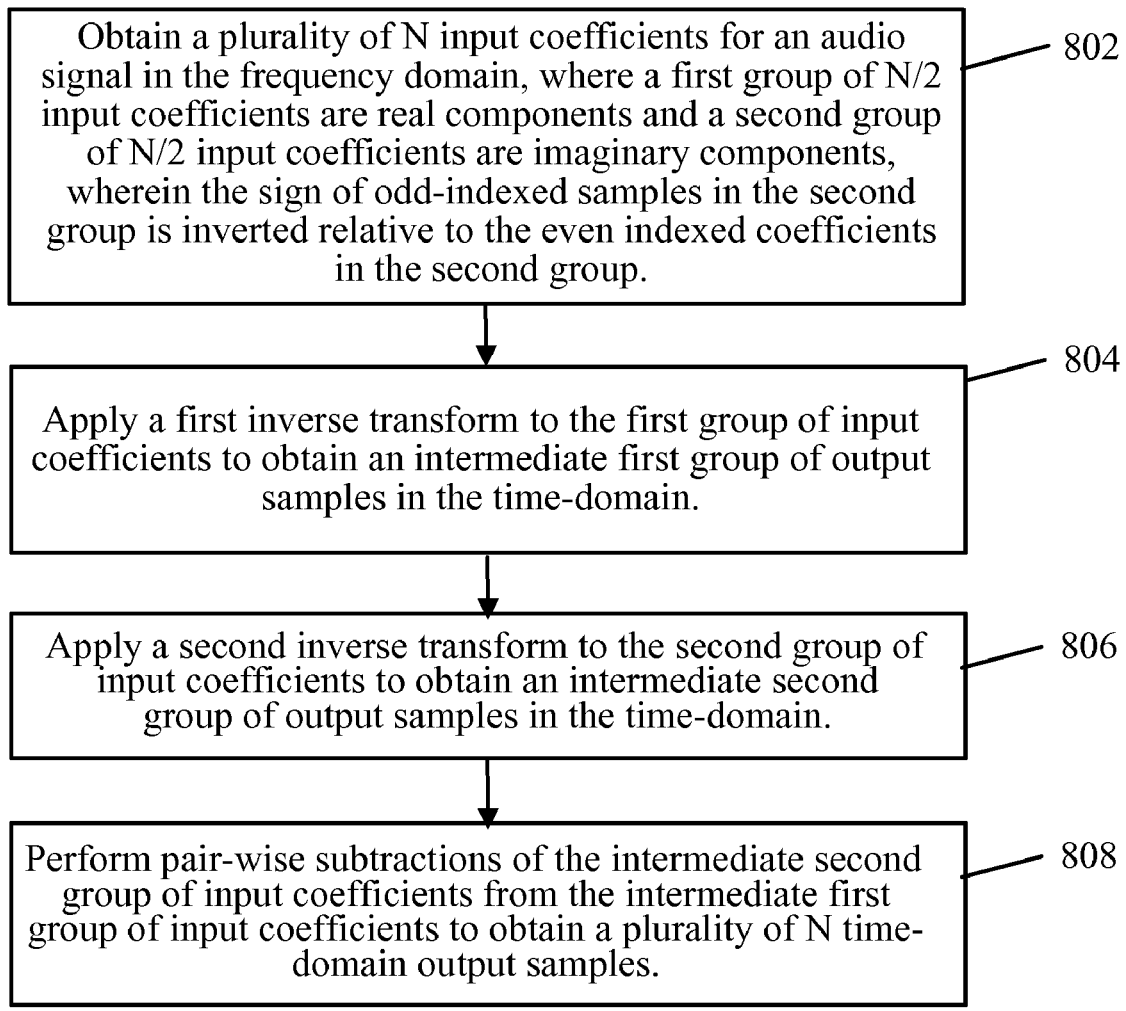
FIG. 8 illustrates a method to implement a synthesis filterbank according to one example.

FIG. 8 illustrates a method to implement a synthesis filterbank according to one example. A plurality of N input coefficients may be obtained for an audio signal in the frequency domain, where a first group of N/2 input coefficients are real components and a second group of N/2 input coefficients are imaginary components, wherein the sign of odd-indexed samples in the second group is inverted relative to the even indexed coefficients in the second group 802. The first group of input coefficients may consist of real coefficients and the second group of input coefficients consists of imaginary coefficients. The frequency domain may be a complex domain while the time-domain samples are samples in a real domain.

A first inverse transform may then be applied to the first group of input coefficients to obtain an intermediate first group of output samples in the time-domain 804. A second inverse transform may also be applied to the second group of input coefficients to obtain an intermediate second group of output samples in the time-domain 806. The first and second inverse transforms may operate concurrently to transform the first and second groups of input coefficients. The first inverse transform and second inverse transform may be Inverse Discrete Cosine Transform (IDCT) type IV transforms. Pair-wise subtractions of the intermediate second group of input coefficients from the intermediate first group of input coefficients may be performed to obtain a plurality of N time-domain output samples 808.

In various implementations, the filterbank may be a Synthesis Quadrature Mirror Filterbank, part of an audio decoder, and/or part of a Spectral Band Replication (SBR) decoder. The audio decoder implements at least one of a MPEG-4 Advance Audio Coding (AAC)-Low Delay (ELD) standard, a MPEG-4 AAC-Enhanced Low Delay (ELD) standard, and a MPEG-4 MPEG-4 High Efficiency (HE)-AAC standard.

Figure 9:
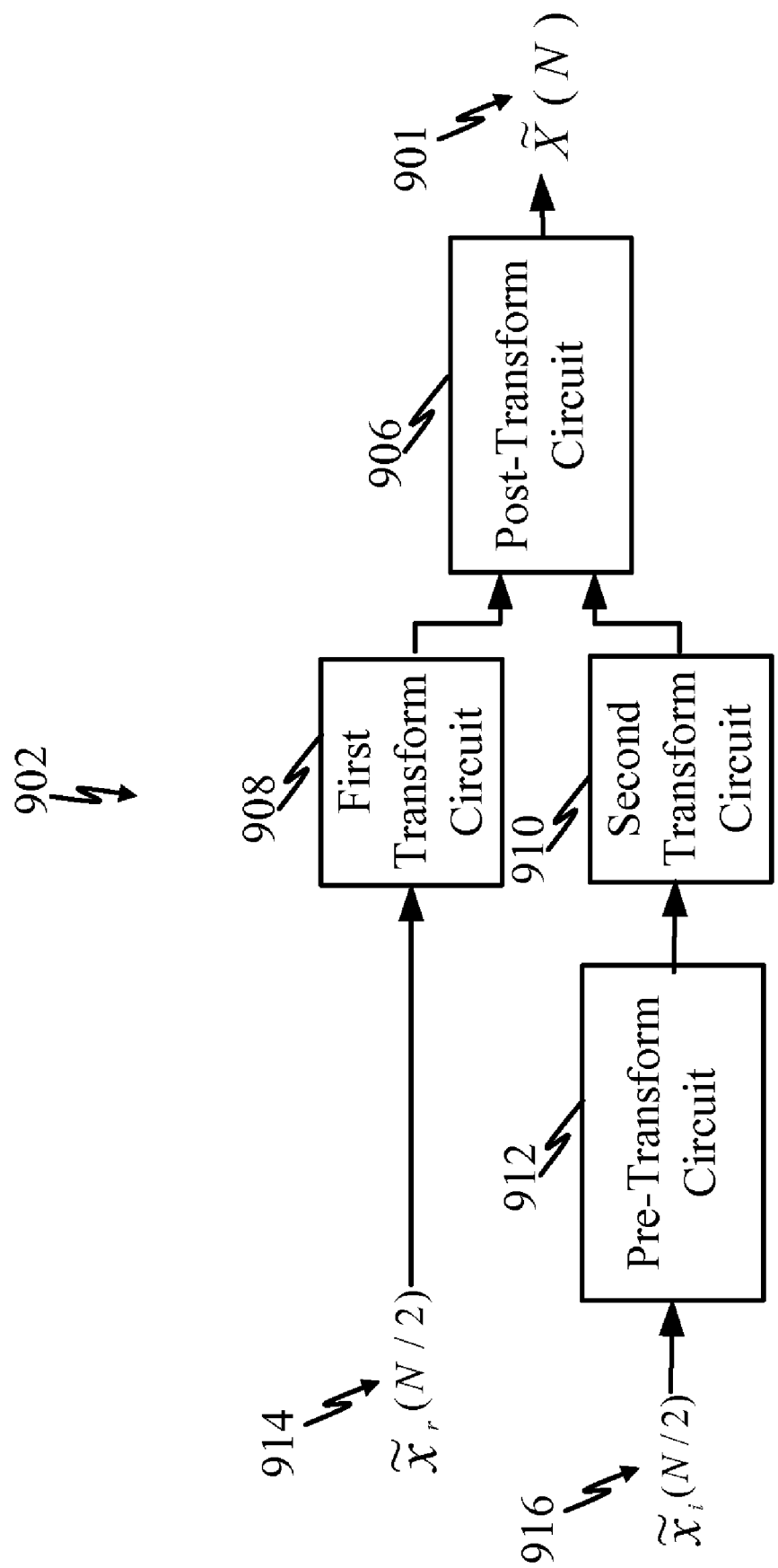
FIG. 9 is a block diagram illustrating function components for implementing a synthesis filterbank according to one example.

FIG. 9 is a block diagram illustrating function components for implementing a synthesis filterbank according to one example. The synthesis filterbank 902 may include an interface adapted to obtain a plurality of N input coefficients for an audio signal in the frequency domain, where a first group 914 of N/2 input coefficients are real components and a second group 916 of N/2 input coefficients are imaginary components. A pre-processing circuit 912 may be adapted to reverse the sign of odd-indexed samples in the second group relative to the even indexed coefficients in the second group. A first transform circuit 908 may be adapted to apply a first inverse transform to the first group of input coefficients to obtain an intermediate first group of output samples in the time-domain. A second transform circuit 910 may be adapted to apply a second inverse transform to the second group of input coefficients to obtain an intermediate second group of output samples in the time-domain. A post-transform circuit 906 may be adapted to perform pair-wise subtractions of the intermediate second group of input coefficients from the intermediate first group of input coefficients to obtain a plurality of N time-domain output samples 901.

Exemplary Factorization of Real Analysis Filterbank

Note that the real analysis filterbank of Equation 48 is odd phased or indexed, which means that the numerator of the SBR equation includes a factor (2n±x) where x is an odd number. In the examples of above, Equation 48 includes (2n+1). In practice, implementing these filterbanks in encoders/decoders is difficult due to their complexity which causes delays and require more processing resources.

Therefore, one feature transforms these SBR algorithms (e.g., Equation 48) so that they can be represented based on a core DCT-IV transform (e.g., Equation 7). That is, by implementing the SBR algorithms based on an efficient DCT-IV transform, the SBR algorithm can be executed more efficiently (e.g., requires less processing resources or can be performed more quickly).

Figure 10:
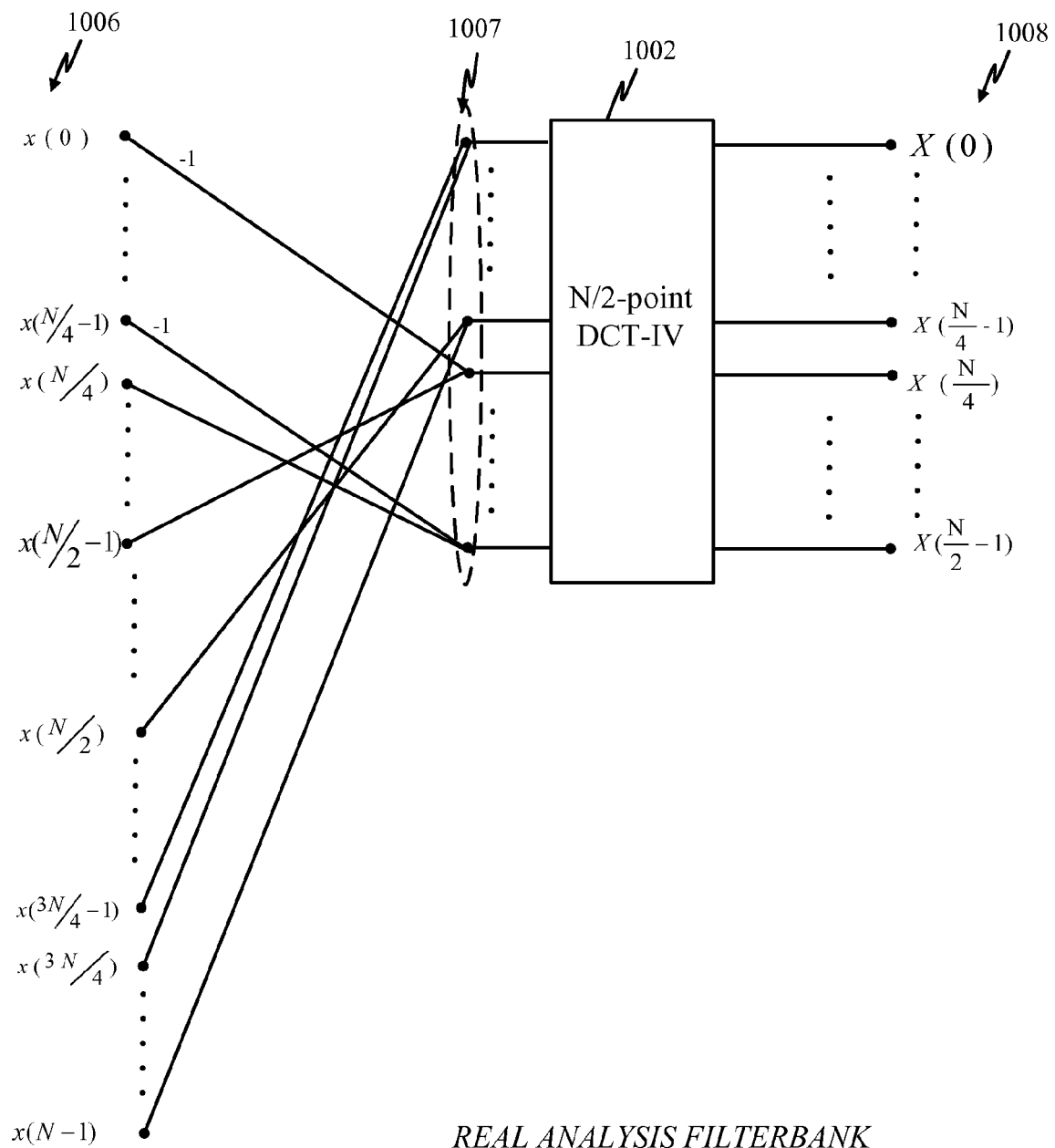
FIG. 10 illustrates an example of an efficient real-domain analysis filterbank.

FIG. 10 illustrates an example of an efficient real-domain analysis filterbank. An input audio signal is sampled into a plurality of time-domain input samples 1006 (i.e., N-point samples). Pair-wise sums and subtractions 1007 of the time-domain input samples (e.g., values) are taken to obtain at group 1007 on N/2 intermediate samples. A first DCT-IV transform 1002 is applied to the group 1007 of N/2 intermediate samples to obtain a group 1008 of output coefficients in the frequency-domain. Here, the resulting group 1008 of output coefficients represents real components.

Figure 11:
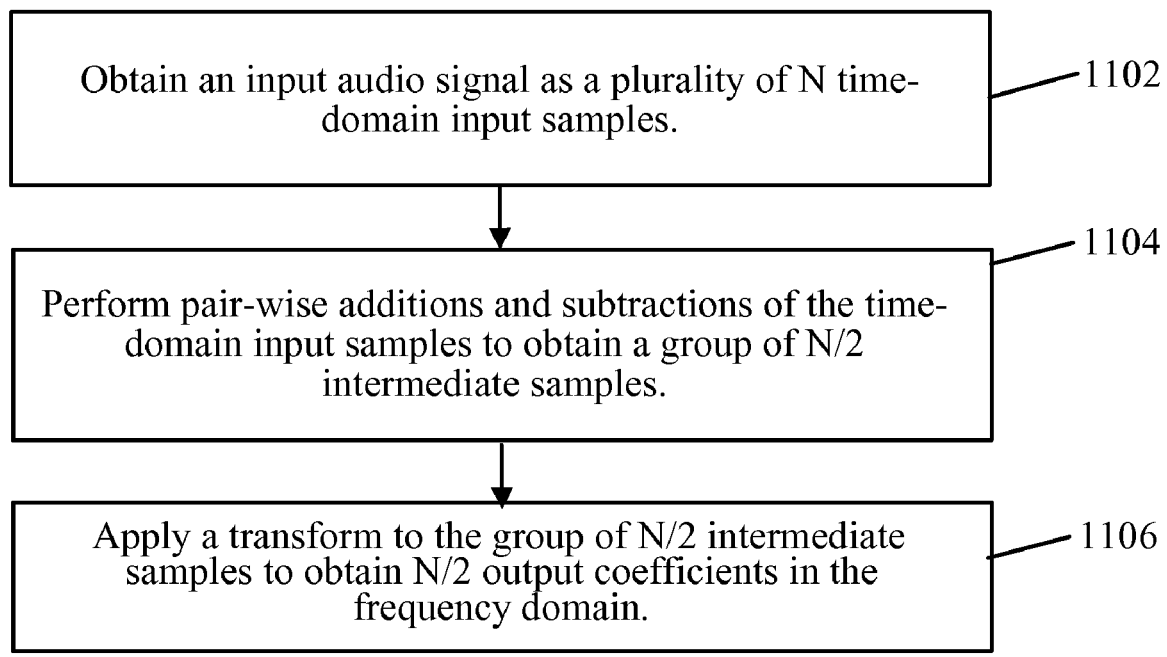
FIG. 11 illustrates a method for implementing an analysis filterbank according to one example.

FIG. 11 illustrates a method for implementing an analysis filterbank according to one example. An input audio signal may be obtained as a plurality of N time-domain input samples 1102. Pair-wise additions and subtractions of the time-domain input samples may be performed to obtain a group of N/2 intermediate samples 1104. A transform may then be applied to the group of N/2 intermediate samples to obtain N/2 output coefficients in the frequency domain 1106. The time-domain input samples and frequency domain coefficients may be real numbers. The transform may be a Discrete Cosine Transform (DCT) type IV transform.

In various implementations, the filterbank may be an Analysis Quadrature Mirror Filterbank, part of an audio encoder, part of a Spectral Band Replication (SBR) encoder/decoder, and/or part of an audio decoder. The audio encoder/decoder may implement at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

Figure 12:
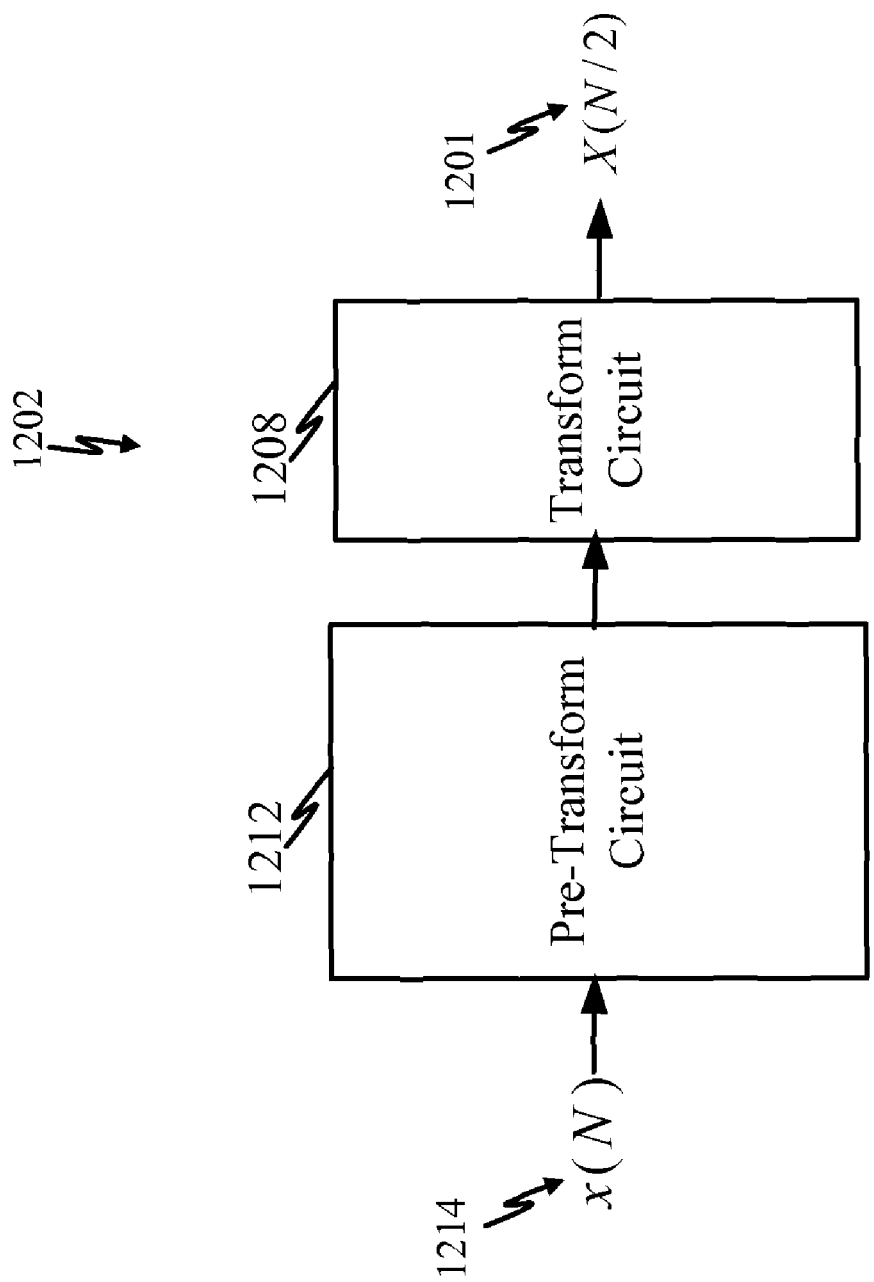
FIG. 12 is a block diagram illustrating function components for implementing an analysis filterbank according to one example.

FIG. 12 is a block diagram illustrating function components for implementing an analysis filterbank according to one example. The filterbank device 1202 may include an interface adapted to obtain an input audio signal 1214 as a plurality of N time-domain input samples. A pre-transform circuit 1212 may be adapted to perform pair-wise additions and subtractions of the time-domain input samples 1214 to obtain a group of N/2 intermediate samples. A transform circuit 1208 may be adapted to apply a transform to the group of N/2 intermediate samples to obtain N/2 output coefficients 1201 in the frequency domain.

Exemplary Factorization of Real Synthesis Filterbank

Note that the real synthesis filterbank of Equation 50 is odd phased or indexed, which means that the numerator of the SBR equation includes a factor (2n±x) where x is an odd number. In the examples of above, Equation 50 includes (2n+1). In practice, implementing these filterbanks in decoders is difficult due to their complexity which causes delays and/or require more processing resources.

Therefore, one feature transforms these SBR algorithms (e.g., Equation 50) so that they can be represented based on a core DCT-IV transform (e.g., Equation 7). That is, by implementing the SBR algorithms based on an efficient DCT-IV transform, the SBR algorithm can be executed more efficiently (e.g., requires less processing resources or can be performed more quickly).

Figure 13:
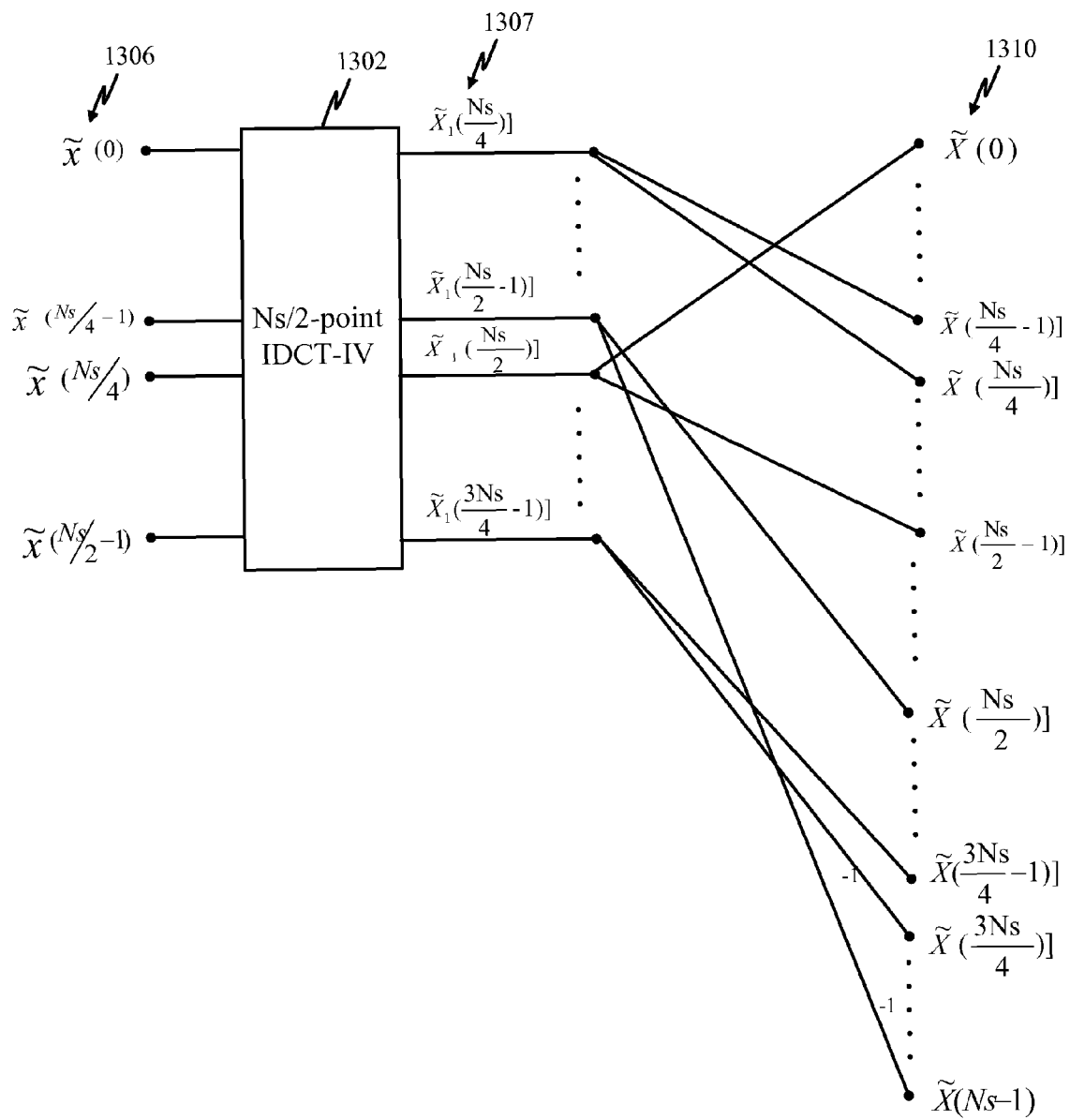
FIG. 13 illustrates an example of an efficient real-domain synthesis filterbank.

FIG. 13 illustrates an example of an efficient real-domain synthesis filterbank. A plurality of N/2 input coefficients 1306 are obtained for an audio signal in the frequency domain. An inverse transform 1302 is applied to the group of N/2 input coefficients to obtain an intermediate group 1307 of N output samples in the time-domain. Replication, sign inversion, and reordering of coefficients may be performed from the intermediate group 1307 of N input coefficients to obtain a plurality 1310 of N time-domain output samples.

Figure 14:
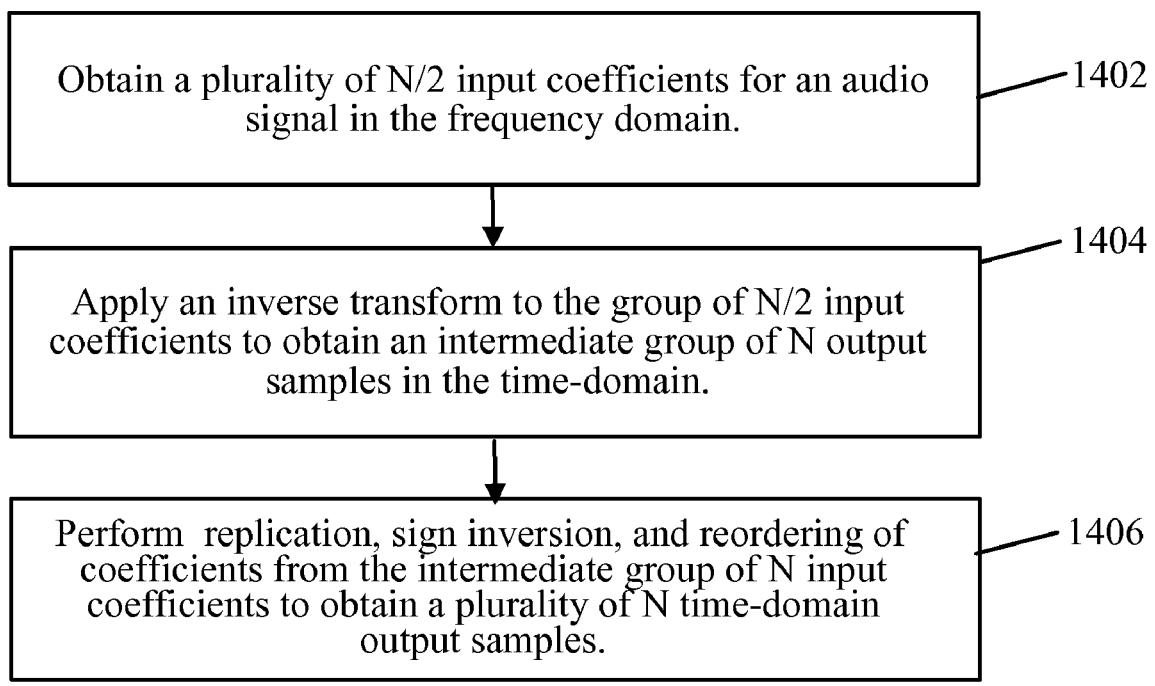
FIG. 14 illustrates a method for implementing a synthesis filterbank according to one example.

FIG. 14 illustrates a method for implementing a synthesis filterbank according to one example. A plurality of N/2 input coefficients for an audio signal in the frequency domain may be obtained 1402. An inverse transform may be applied to the group of N/2 input coefficients to obtain an intermediate group of N output samples in the time-domain 1404. Replication, sign inversion, and reordering of coefficients from the intermediate group of N input coefficients may be performed to obtain a plurality of N time-domain output samples 1406.

In various implementations, the filterbank may be an Synthesis Quadrature Mirror Filterbank, part of an audio decoder, part of a Spectral Band Replication (SBR) decoder. The audio decoder may implement at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

Figure 15:
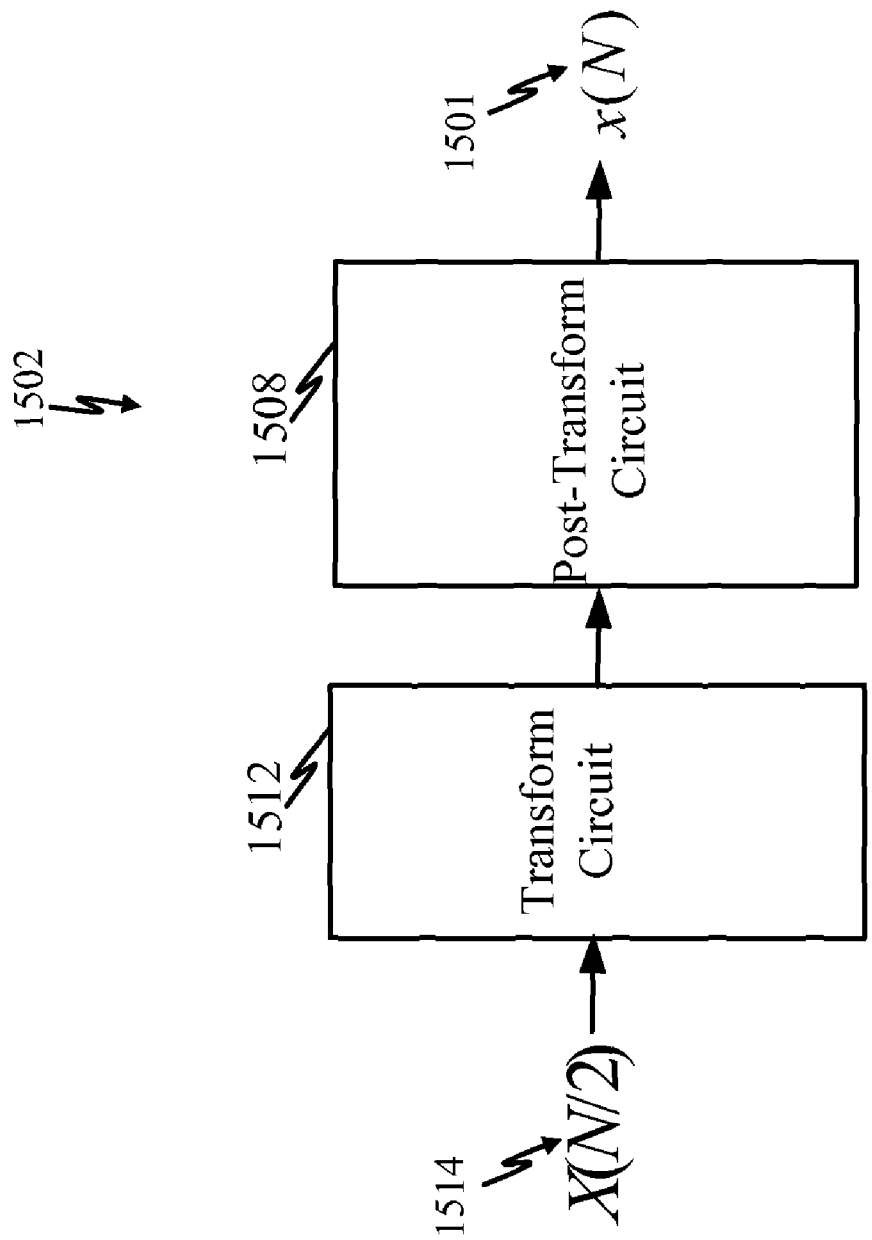
FIG. 15 is a block diagram illustrating function components for implementing a synthesis filterbank according to one example.

FIG. 15 is a block diagram illustrating function components for implementing a synthesis filterbank according to one example. The filterbank device 1502 may include an interface adapted to obtain a plurality of N/2 input coefficients 1514 for an audio signal in the frequency domain. A transform circuit 1512 may be adapted to apply an inverse transform to the group of N/2 input coefficients 1514 to obtain an intermediate group of N output samples in the time-domain. A post-transform circuit 1508 may be adapted to perform replication, sign inversion, and reordering of coefficients from the intermediate group of N input coefficients to obtain a plurality of N time-domain output samples 1501.

Fast Algorithms for SBR Filterbanks in HE-AAC and USAC

HE-AAC, HE-AAC v2, and USAC use similar SBR filterbank structures as those previously described herein. Perhaps most important distinction being that their phase shifts are represented by even (as opposed to odd in AAC-ELD case) numbers. For example, the real analysis filterbanks in HE-AAC is defined, as follows:

$$X_R(k) = \sum_{n=0}^{63} x(n)\cos\left\{\frac{\pi(2k+1)(n-48)}{64}\right\}, k = 0, \ldots, 31$$

(it uses shift of n by 48, instead of 95 in ELD-AAC).

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits and algorithm steps described herein may be implemented or performed as electronic hardware, software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. It is noted that the configurations may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

When implemented in hardware, various examples may employ a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any conventional processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

When implemented in software, various examples may employ firmware, middleware or microcode. The program code or code segments to perform the necessary tasks may be stored in a computer-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

As used in this application, the terms "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In one or more examples herein, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. Software may comprise a single instruction, or many instructions, and may be distributed over several different code segments, among different programs and across multiple storage media. An exemplary storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is required for proper operation of the embodiment that is being described, the order and/or use of specific steps and/or actions may be modified without departing from the scope of the claims.

One or more of the components, steps, and/or functions illustrated in the Figures may be rearranged and/or combined into a single component, step, or function or embodied in several components, steps, or functions. Additional elements, components, steps, and/or functions may also be added. The apparatus, devices, and/or components illustrated in Figures may be configured or adapted to perform one or more of the methods, features, or steps described in other Figures. The algorithms described herein may be efficiently implemented in software and/or embedded hardware for example.

It should be noted that the foregoing configurations are merely examples and are not to be construed as limiting the claims. The description of the configurations is intended to be illustrative, and not to limit the scope of the claims. As such, the present teachings can be readily applied to other types of apparatuses and many alternatives, modifications, and variations will be apparent to those skilled in the art.

What is claimed is:

1. A method of implementing a filterbank, comprising:
    obtaining an input audio signal as a plurality of N time-domain input samples;
    performing pair-wise additions and subtractions of the time-domain input samples to obtain a first group and second group of intermediate samples, each group having N/2 intermediate samples;
    inverting the signs of odd-indexed intermediate samples in the second group;
    applying a first transform to the first group of intermediate samples to obtain a first group of output coefficients in the frequency domain;
    applying a second transform to the second group of intermediate samples to obtain an intermediate second group of output coefficients in the frequency domain; and
    reversing the order of coefficients in the intermediate second group of output coefficients to obtain a second group of output coefficients.

2. The method of claim 1, wherein the time-domain input samples used are samples in a real domain while the frequency domain is a complex domain.

3. The method of claim 1, wherein the first group of output coefficients consists of real coefficients and the second group of output coefficients consists of imaginary coefficients.

4. The method of claim 1, wherein the first transform and second transform are both Discrete Cosine Transform (DCT) type IV transforms and the filterbank is represented by an equation having a factor of (2n±x) in the numerator, where x is an odd number.

5. The method of claim 1, wherein the first and second transforms operate concurrently to transform the first and second groups of intermediate samples.

6. The method of claim 1, wherein the filterbank is an Analysis Quadrature Mirror Filterbank.

7. The method of claim 1, wherein the filterbank is part of an audio encoder.

8. The method of claim 7, wherein the audio encoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

9. The method of claim 1, wherein the filterbank is part of a Spectral Band Replication (SBR) encoder.

10. The method of claim 1, wherein the filterbank is part of an audio decoder.

11. The method of claim 10, wherein the audio decoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

12. The method of claim 1, wherein the filterbank is part of a Spectral Band Replication (SBR) decoder.

13. A filterbank device, comprising:
an interface adapted to obtain an input audio signal as a plurality of N time-domain input samples;
a pre-transform circuit adapted to:
perform pair-wise additions and subtractions of the time-domain input samples to obtain a first group and second group of intermediate samples, each group having N/2 intermediate samples;
invert the signs of odd-indexed intermediate samples in the second group;
a first transform circuit adapted to apply a first transform to the first group of intermediate samples to obtain a first group of output coefficients in the frequency domain;
a second transform circuit adapted to apply a second transform to the second group of intermediate samples to obtain an intermediate second group of output coefficients in the frequency domain; and
a post-transform circuit adapted to reverse the order of coefficients in the intermediate second group of output coefficients to obtain a second group of output coefficients.

14. The filterbank device of claim 13, wherein the time-domain input samples used are samples in a real domain while the frequency domain is a complex domain.

15. The filterbank device of claim 13, wherein the first group of output coefficients consists of real coefficients and the second group of output coefficients consists of imaginary coefficients.

16. The filterbank device of claim 13, wherein the first transform and second transform are both Discrete Cosine Transform (DCT) type IV transforms and the filterbank is represented by an equation having a factor of (2n±x) in the numerator, where x is an odd number.

17. The filterbank device of claim 13, wherein the first and second transforms operate concurrently to transform the first and second groups of intermediate samples.

18. The filterbank device of claim 13, wherein the filterbank device is an Analysis Quadrature Mirror Filterbank.

19. The filterbank device of claim 13, wherein the filterbank is part of an audio encoder.

20. The filterbank device of claim 19, wherein the audio encoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

21. The filterbank device of claim 13, wherein the filterbank is part of a Spectral Band Replication (SBR) encoder.

22. The filterbank device of claim 13, wherein the filterbank is part of an audio decoder.

23. The filterbank device of claim 22, wherein the audio decoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

24. The filterbank device of claim 13, wherein the filterbank is part of a Spectral Band Replication (SBR) decoder.

25. A filterbank device, comprising:
means for obtaining an input audio signal as a plurality of N time-domain input samples;
means for performing pair-wise additions and subtractions of the time-domain input samples to obtain a first group and second group of intermediate samples, each group having N/2 intermediate samples;
means for inverting the signs of odd-indexed intermediate samples in the second group;
means for applying a first transform to the first group of intermediate samples to obtain a first group of output coefficients in the frequency domain;
means for applying a second transform to the second group of intermediate samples to obtain an intermediate second group of output coefficients in the frequency domain; and
means for reversing the order of coefficients in the intermediate second group of output coefficients to obtain a second group of output coefficients.

26. The filterbank device of claim 25, wherein the filterbank is part of an audio encoder.

27. The filterbank device of claim 26, wherein the audio encoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

28. The filterbank device of claim 25, wherein the filterbank is part of a Spectral Band Replication (SBR) encoder.

29. The filterbank device of claim 25, wherein the filterbank is part of an audio decoder.

30. A machine-readable medium comprising instructions operational to implement a filterbank, which when executed by one or more processors causes the processors to:
obtain an input audio signal as a plurality of N time-domain input samples;
perform pair-wise additions and subtractions of the time-domain input samples to obtain a first group and second group of intermediate samples, each group having N/2 intermediate samples;
invert the signs of odd-indexed intermediate samples in the second group;
apply a first transform to the first group of intermediate samples to obtain a first group of output coefficients in the frequency domain;

apply a second transform to the second group of intermediate samples to obtain an intermediate second group of output coefficients in the frequency domain; and reverse the order of coefficients in the intermediate second group of output coefficients to obtain a second group of output coefficients.

31. The machine-readable medium of claim 30, wherein the time-domain input samples used are samples in a real domain while the frequency domain is a complex domain.

32. The machine-readable medium of claim 30, wherein the first group of output coefficients consists of real coefficients and the second group of output coefficients consists of imaginary coefficients.

33. A method of implementing a filterbank, comprising:
obtaining a plurality of N input coefficients for an audio signal in the frequency domain, where a first group of N/2 input coefficients are real components and a second group of N/2 input coefficients are imaginary components, wherein the sign of odd-indexed samples in the second group is inverted relative to the even indexed coefficients in the second group;

applying a first inverse transform to the first group of input coefficients to obtain an intermediate first group of output samples in the time-domain;

applying a second inverse transform to the second group of input coefficients to obtain an intermediate second group of output samples in the time-domain; and performing pair-wise subtractions of the intermediate second group of input coefficients from the intermediate first group of input coefficients to obtain a plurality of N time-domain output samples.

34. The method of claim 33, wherein the first group of input coefficients consists of real coefficients and the second group of input coefficients consists of imaginary coefficients.

35. The method of claim 33, wherein the frequency domain is a complex domain while the time-domain samples are samples in a real domain.

36. The method of claim 33, wherein the first inverse transform and second inverse transform are both Inverse Discrete Cosine Transform (IDCT) type IV transforms and the filterbank is represented by an equation having a factor of $(2n\pm x)$ in the numerator, where x is an odd number.

37. The method of claim 33, wherein the first and second inverse transforms operate concurrently to transform the first and second groups of input coefficients.

38. The method of claim 33, wherein the filterbank is a Synthesis Quadrature Mirror Filterbank.

39. The method of claim 33, wherein the filterbank is part of an audio decoder.

40. The method of claim 39, wherein the audio decoder implements at least one of a MPEG-4 Advance Audio Coding (AAC)-Low Delay (ELD) standard, a MPEG-4 AAC-Enhanced Low Delay (ELD) standard, and a MPEG-4 MPEG-4 High Efficiency (HE)-AAC standard.

41. The method of claim 33, wherein the filterbank is part of a Spectral Band Replication (SBR) decoder.

42. A filterbank device, comprising:
an interface adapted to obtain a plurality of N input coefficients for an audio signal in the frequency domain, where a first group of N/2 input coefficients are real components and a second group of N/2 input coefficients are imaginary components;

a pre-processing circuit adapted to reverse the sign of odd-indexed samples in the second group relative to the even indexed coefficients in the second group;

a first transform circuit adapted to apply a first inverse transform to the first group of input coefficients to obtain an intermediate first group of output samples in the time-domain;

a second transform circuit adapted to apply a second inverse transform to the second group of input coefficients to obtain an intermediate second group of output samples in the time-domain; and a post-transform circuit adapted to perform pair-wise subtractions of the intermediate second group of input coefficients from the intermediate first group of input coefficients to obtain a plurality of N time-domain output samples.

43. The filterbank device of claim 42, wherein the first group of input coefficients consists of real coefficients and the second group of input coefficients consists of imaginary coefficients.

44. The filterbank device of claim 42, wherein the frequency domain is a complex domain while the time-domain samples are samples in a real domain.

45. The filterbank device of claim 42, wherein the first inverse transform and second inverse transform are both Inverse Discrete Cosine Transform (IDCT) type IV transforms and the filterbank is represented by an equation having a factor of $(2n\pm x)$ in the numerator, where x is an odd number.

46. The filterbank device of claim 42, wherein the first and second inverse transforms operate concurrently to transform the first and second groups of input coefficients.

47. The filterbank device of claim 42, wherein the filterbank is a Synthesis Quadrature Mirror Filterbank.

48. The filterbank device of claim 42, wherein the filterbank is part of an audio decoder.

49. The filterbank device of claim 48, wherein the audio decoder implements at least one of a MPEG-4 Advance Audio Coding (AAC)-Low Delay (ELD) standard, a MPEG-4 AAC-Enhanced Low Delay (ELD) standard, and a MPEG-4 MPEG-4 High Efficiency (HE)-AAC standard.

50. The filterbank device of claim 42, wherein the filterbank is part of a Spectral Band Replication (SBR) decoder.

51. A filterbank device, comprising:
means for obtaining a plurality of N input coefficients for an audio signal in the frequency domain, where a first group of N/2 input coefficients are real components and a second group of N/2 input coefficients are imaginary components, wherein the sign of odd-indexed samples in the second group is inverted relative to the even indexed coefficients in the second group;

means for applying a first inverse transform to the first group of input coefficients to obtain an intermediate first group of output samples in the time-domain;

means for applying a second inverse transform to the second group of input coefficients to obtain an intermediate second group of output samples in the time-domain; and means for performing pair-wise subtractions of the intermediate second group of input coefficients from the intermediate first group of input coefficients to obtain a plurality of N time-domain output samples.

52. The filterbank device of claim 51, wherein the filterbank is a Synthesis Quadrature Mirror Filterbank.

53. The filterbank device of claim 51, wherein the filterbank is part of an audio decoder.

54. The filterbank device of claim 53, wherein the audio decoder implements at least one of a MPEG-4 Advance Audio Coding (AAC)-Low Delay (ELD) standard, a MPEG-4 AAC-Enhanced Low Delay (ELD) standard, and a MPEG-4 MPEG-4 High Efficiency (HE)-AAC standard.

55. The filterbank device of claim 51, wherein the filterbank is part of a Spectral Band Replication (SBR) decoder.

56. A machine-readable medium comprising instructions operational to implement a filterbank, which when executed by one or more processors causes the processors to:
obtain an input audio signal as a plurality of N time-domain input samples;
perform pair-wise additions and subtractions of the time-domain input samples to obtain a first group and second group of intermediate samples, each group having N/2 intermediate samples;
invert the signs of odd-indexed intermediate samples in the second group;
apply a first transform to the first group of intermediate samples to obtain a first group of output coefficients in the frequency domain;
apply a second transform to the second group of intermediate samples to obtain an intermediate second group of output coefficients in the frequency domain; and
reverse the order of coefficients in the intermediate second group of output coefficients to obtain a second group of output coefficients.

57. The machine-readable medium of claim 56, wherein the first group of input coefficients consists of real coefficients and the second group of input coefficients consists of imaginary coefficients.

58. The machine-readable medium of claim 56, wherein the frequency domain is a complex domain while the time-domain samples are samples in a real domain.

59. A method of implementing a filterbank, comprising:
obtaining an input audio signal as a plurality of N time-domain input samples;
performing pair-wise additions and subtractions of the time-domain input samples to obtain a group of N/2 intermediate samples; and
applying a transform to the group of N/2 intermediate samples to obtain N/2 output coefficients in the frequency domain.

60. The method of claim 59, wherein both time-domain input samples and frequency domain coefficients are real numbers.

61. The method of claim 59, wherein the transform is a Discrete Cosine Transform (DCT) type IV transform and the filterbank is represented by an equation having a factor of (2n±x) in the numerator, where x is an odd number.

62. The method of claim 59, wherein the filterbank is an Analysis Quadrature Mirror Filterbank.

63. The method of claim 59, wherein the filterbank is part of an audio encoder.

64. The method of claim 63, wherein the audio encoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

65. The method of claim 59, wherein the filterbank is part of a Spectral Band Replication (SBR) encoder.

66. The method of claim 59, wherein the filterbank is part of an audio decoder.

67. The method of claim 65, wherein the audio decoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

68. The method of claim 59, wherein the filterbank is part of a Spectral Band Replication (SBR) decoder.

69. A filterbank device, comprising:
an interface adapted to obtain an input audio signal as a plurality of N time-domain input samples;
a pre-transform circuit adapted to perform pair-wise additions and subtractions of the time-domain input samples to obtain a group of N/2 intermediate samples; and
a transform circuit adapted to apply a transform to the group of N/2 intermediate samples to obtain N/2 output coefficients in the frequency domain.

70. The filterbank device of claim 69, wherein both time-domain input samples and frequency domain coefficients are real numbers.

71. The filterbank device of claim 69, wherein the transform is a Discrete Cosine Transform (DCT) type IV transform.

72. The filterbank device of claim 69, wherein the filterbank is an Analysis Quadrature Mirror Filterbank.

73. The filterbank device of claim 69, wherein the filterbank is part of an audio encoder.

74. The filterbank device of claim 73, wherein the audio encoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

75. The filterbank device of claim 69, wherein the filterbank is part of a Spectral Band Replication (SBR) encoder.

76. The filterbank device of claim 69, wherein the filterbank is part of an audio decoder.

77. The filterbank device of claim 76, wherein the audio decoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

78. The filterbank device of claim 69, wherein the filterbank is part of a Spectral Band Replication (SBR) decoder.

79. A filterbank device, comprising:
means for obtaining an input audio signal as a plurality of N time-domain input samples;
means for performing pair-wise additions and subtractions of the time-domain input samples to obtain a group of N/2 intermediate samples; and
means for applying a transform to the group of N/2 intermediate samples to obtain N/2 output coefficients in the frequency domain.

80. The filterbank device of claim 79, wherein the filterbank is an Analysis Quadrature Mirror Filterbank.

81. The filterbank device of claim 79, wherein the filterbank is part of an audio encoder.

82. The filterbank device of claim 79, wherein the filterbank is part of a Spectral Band Replication (SBR) encoder.

83. The filterbank device of claim 79, wherein the filterbank is part of an audio decoder.

84. A machine-readable medium comprising instructions operational to implement a filterbank, which when executed by one or more processors causes the processors to:
obtain an input audio signal as a plurality of N time-domain input samples;
perform pair-wise additions and subtractions of the time-domain input samples to obtain a group of N/2 intermediate samples; and
apply a transform to the group of N/2 intermediate samples to obtain N/2 output coefficients in the frequency domain.

85. The machine-readable medium of claim 84, wherein both time-domain input samples and frequency domain coefficients are real numbers.

86. The machine-readable medium of claim 84, wherein the transform is a Discrete Cosine Transform (DCT) type IV transform.

87. A method of implementing a filterbank, comprising:
obtaining a plurality of N/2 input coefficients for an audio signal in the frequency domain;
applying an inverse transform to the group of N/2 input coefficients to obtain an intermediate group of N output samples in the time-domain; and
performing replication, sign inversion, and reordering of coefficients from the intermediate group of N input coefficients to obtain a plurality of N time-domain output samples.

88. The method of claim 87, wherein both input coefficients and time-domain output samples are real numbers.

89. The method of claim 87, wherein the inverse transform is a Discrete Cosine Transform (DCT) type IV transform and the filterbank is represented by an equation having a factor of $(2n\pm x)$ in the numerator, where x is an odd number.

90. The method of claim 87, wherein the filterbank is a Synthesis Quadrature Mirror Filterbank.

91. The method of claim 87, wherein the filterbank is part of an audio decoder.

92. The method of claim 91, wherein the audio decoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

93. The method of claim 87, wherein the filterbank is part of a Spectral Band Replication (SBR) decoder.

94. A filterbank device, comprising:
an interface adapted to obtain a plurality of N/2 input coefficients for an audio signal in the frequency domain;
a transform circuit adapted to apply an inverse transform to the group of N/2 input coefficients to obtain an intermediate group of N output samples in the time-domain; and
a post-transform circuit adapted to perform replication, sign inversion, and reordering of coefficients from the intermediate group of N input coefficients to obtain a plurality of N time-domain output samples.

95. The method of claim 94, wherein both input coefficients and time-domain output samples are real numbers.

96. The filterbank device of claim 94, wherein the inverse transform is a Discrete Cosine Transform (DCT) type IV transform and the filterbank is represented by an equation having a factor of $(2n\pm x)$ in the numerator, where x is an odd number.

97. The filterbank device of claim 94, wherein the filterbank device is a Synthesis Quadrature Mirror Filterbank.

98. The filterbank device of claim 94, wherein the filterbank device is part of an audio decoder.

99. The filterbank device of claim 98, wherein the audio decoder implements at least one of a MPEG Advance Audio Coding Enhanced Low Delay (AAC-ELD) standard, a MPEG High Efficiency AAC (HE-AAC) standard, MPEG Spatial Audio Coding (SAOC), and MPEG Unified Speech and Audio Coding (USAC) standard.

100. The filterbank device of claim 94, wherein the filterbank device is part of a Spectral Band Replication (SBR) decoder.

101. A filterbank device, comprising:
means for obtaining a plurality of N/2 input coefficients for an audio signal in the frequency domain;
means for applying an inverse transform to the group of N/2 input coefficients to obtain an intermediate group of N output samples in the time-domain; and
means for performing replication, sign inversion, and reordering of coefficients from the intermediate group of N input coefficients to obtain a plurality of N time-domain output samples.

102. The filterbank device of claim 101, wherein both input coefficients and time-domain output samples are real numbers.

103. A machine-readable medium comprising instructions operational to implement a filterbank, which when executed by one or more processors causes the processors to:
obtain a plurality of N/2 input coefficients for an audio signal in the frequency domain;
apply an inverse transform to the group of N/2 input coefficients to obtain an intermediate group of N output samples in the time-domain; and
perform replication, sign inversion, and reordering of coefficients from the intermediate group of N input coefficients to obtain a plurality of N time-domain output samples.

104. The machine-readable medium of claim 103, wherein both input coefficients and time-domain output samples are real numbers.

* * * * *